United States Patent
Cho

(10) Patent No.: US 8,629,741 B2
(45) Date of Patent: *Jan. 14, 2014

(54) SLOT-TYPE SHIELDING STRUCTURE HAVING EXTENSIONS THAT EXTEND BEYOND THE TOP OR BOTTOM OF A COPLANAR WAVEGUIDE STRUCTURE

(75) Inventor: Shu-Ying Cho, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 13/542,312

(22) Filed: Jul. 5, 2012

(65) Prior Publication Data

US 2012/0274424 A1    Nov. 1, 2012

Related U.S. Application Data

(63) Continuation of application No. 12/400,133, filed on Mar. 9, 2009, now abandoned.

(51) Int. Cl.
*H01P 3/08* (2006.01)

(52) U.S. Cl.
USPC .................................... 333/238; 333/1; 333/4

(58) Field of Classification Search
USPC ................................ 333/1, 238, 161, 34, 4, 5
See application file for complete search history.

(56) References Cited

U.S. PATENT DOCUMENTS

| | | | |
|---|---|---|---|
| 3,398,232 A | 8/1968 | Hoffman | |
| 5,428,327 A | 6/1995 | Bahl | |
| 5,777,532 A | 7/1998 | Lakin | |
| 5,841,333 A | 11/1998 | Fishburn et al. | |
| 6,060,383 A | 5/2000 | Nogami et al. | |
| 6,465,367 B1 | 10/2002 | Tsai | |
| 6,847,273 B2 | 1/2005 | Shin-Hsuan et al. | |
| 6,864,757 B2 | 3/2005 | Du Toit et al. | |
| 6,950,590 B2 | 9/2005 | Cheung et al. | |
| 6,985,056 B2 | 1/2006 | Kanno | |
| 7,081,648 B2 | 7/2006 | Tsai | |
| 7,102,456 B2 | 9/2006 | Berg | |
| 7,192,530 B2 | 3/2007 | Ryu et al. | |

(Continued)

FOREIGN PATENT DOCUMENTS

| | | |
|---|---|---|
| JP | 05-251914 | 9/1993 |
| KR | 1020070034316 | 3/2007 |
| KR | 10-2008-0054670 | 6/2008 |

OTHER PUBLICATIONS

Korean Patent Office, Office Action dated May 19, 2011, Application No. 10-2010-0008025; 5 page and English translation of 5 pages.

(Continued)

*Primary Examiner* — Benny Lee
(74) *Attorney, Agent, or Firm* — Haynes and Boone, LLP

(57) ABSTRACT

A device that includes a coplanar waveguide structure is disclosed. In an example, a device includes a coplanar waveguide structure that is oriented in a first direction, and a slot-type floating shield structure oriented proximate to the coplanar waveguide structure. The slot-type floating shield structure includes a first portion that extends transversely to the coplanar waveguide structure in a second direction and a second portion that extends from the first portion in a third direction that is perpendicular to the first direction and the second direction.

17 Claims, 34 Drawing Sheets

(56) References Cited

U.S. PATENT DOCUMENTS

| | | |
|---|---|---|
| 7,242,272 B2 | 7/2007 | Ham et al. |
| 7,305,223 B2 | 12/2007 | Liu et al. |
| 8,324,979 B2 * | 12/2012 | Cho .................................. 333/4 |
| 2004/0017270 A1 | 1/2004 | Nagra et al. |
| 2007/0241844 A1 * | 10/2007 | Kim et al. ..................... 333/238 |
| 2009/0072928 A1 | 3/2009 | Guan |
| 2009/0195327 A1 | 8/2009 | Cho et al. |

OTHER PUBLICATIONS

Korean Intellectual Property Office, Notice of Decision for Patent dated May 9, 2012, Application No. 10-2010-0008025, 3 pages.

* cited by examiner

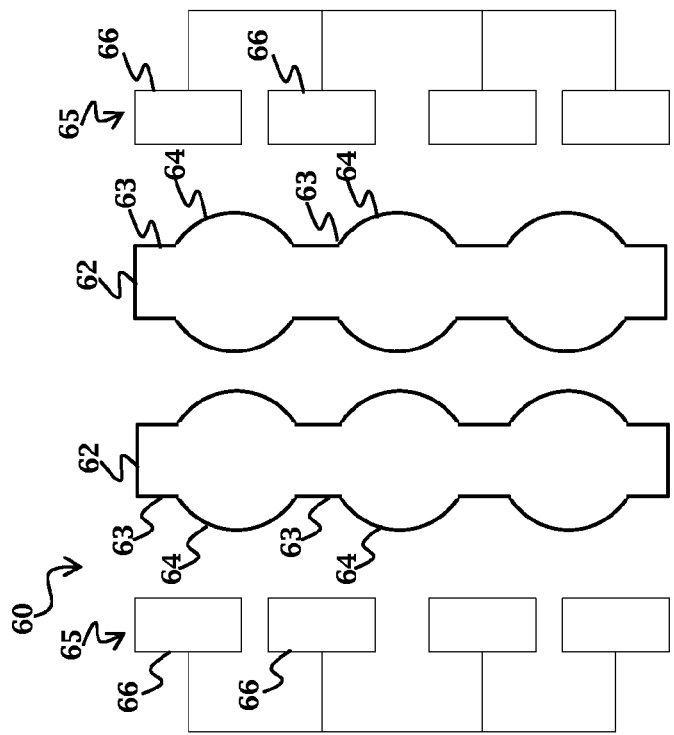
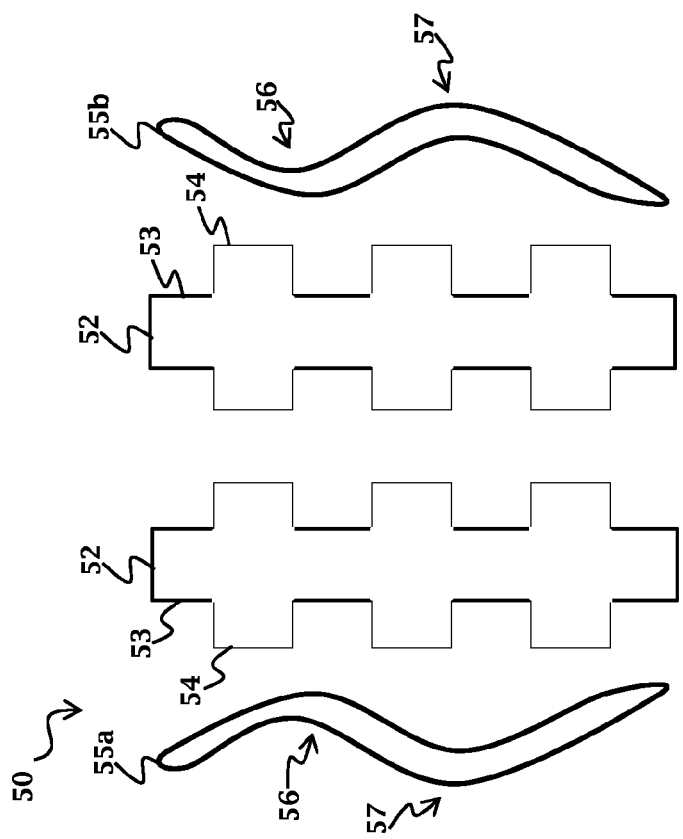
FIG. 3D
FIG. 3C

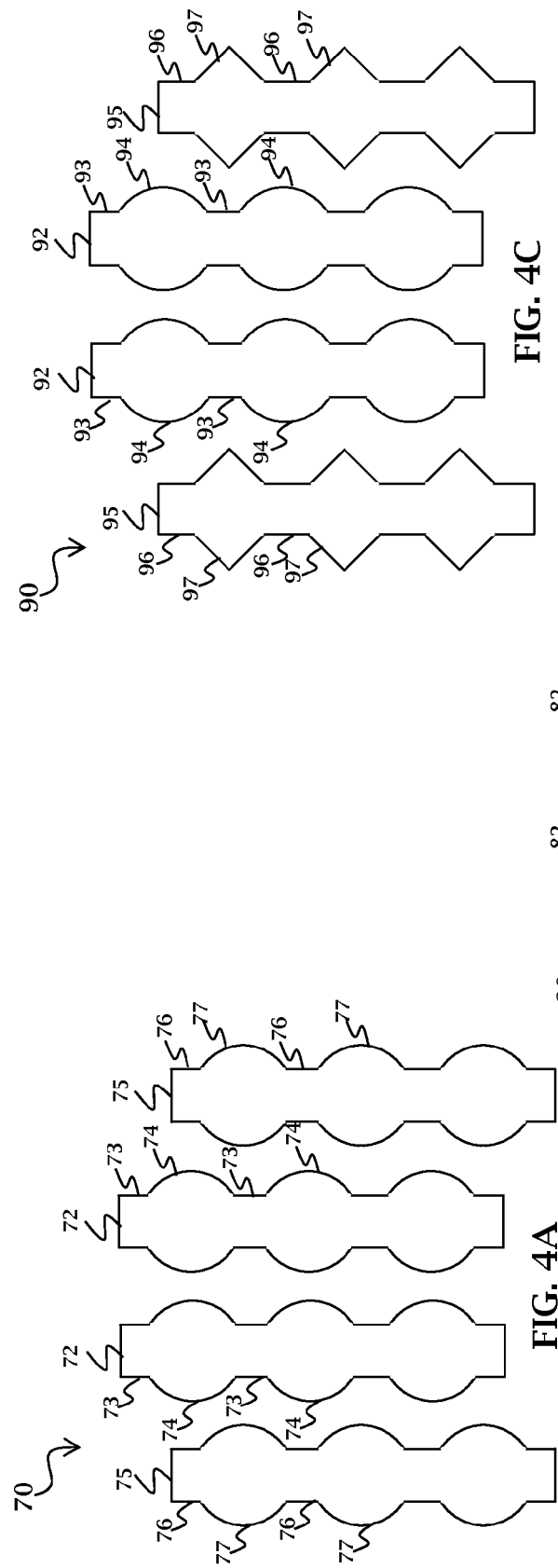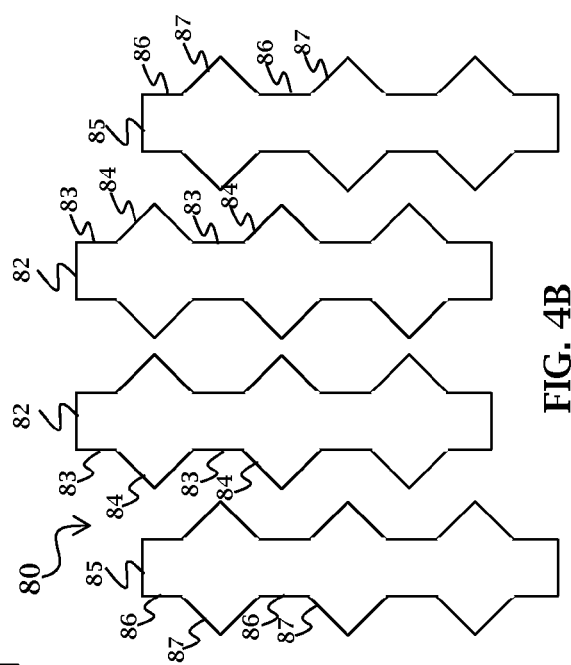

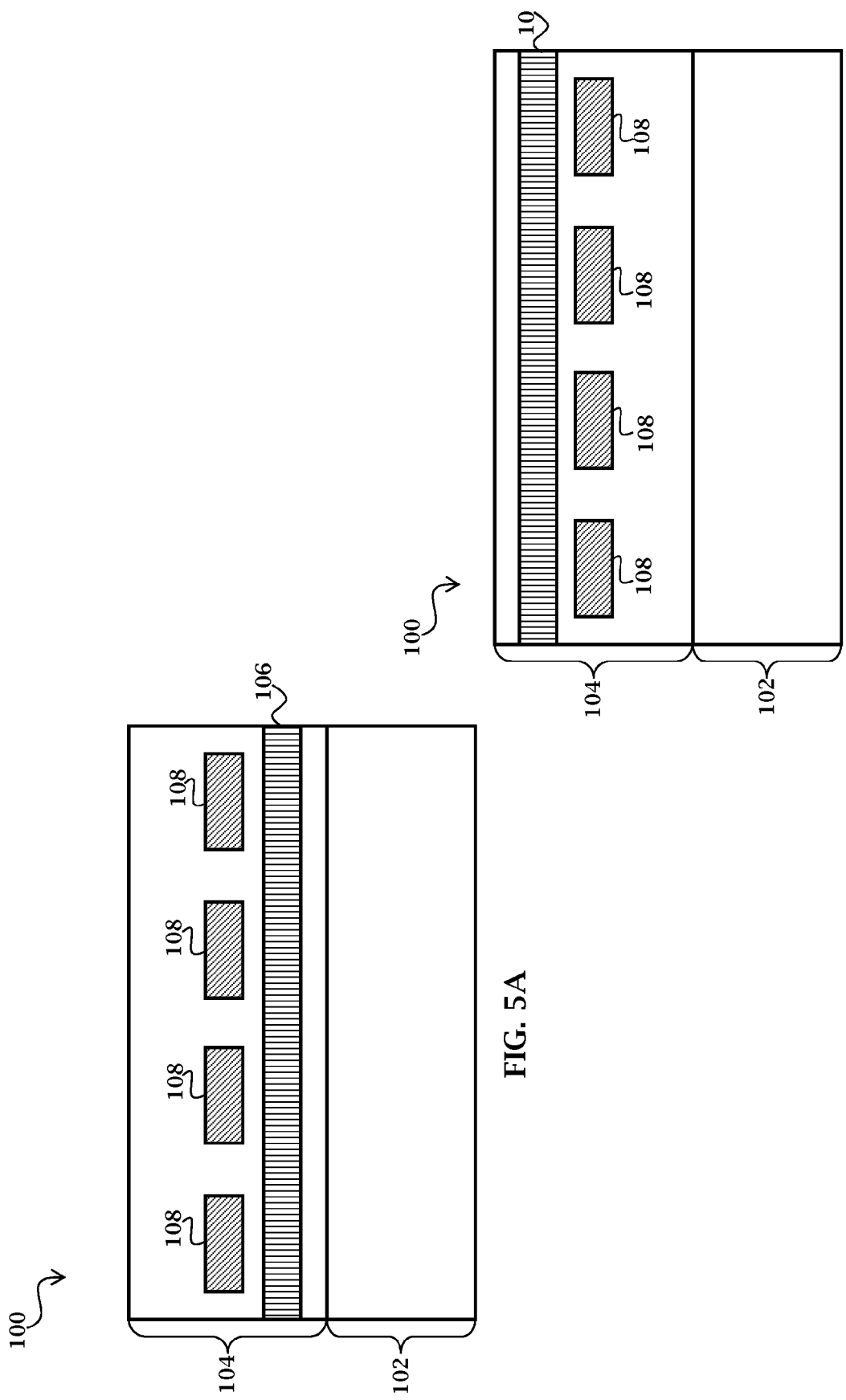

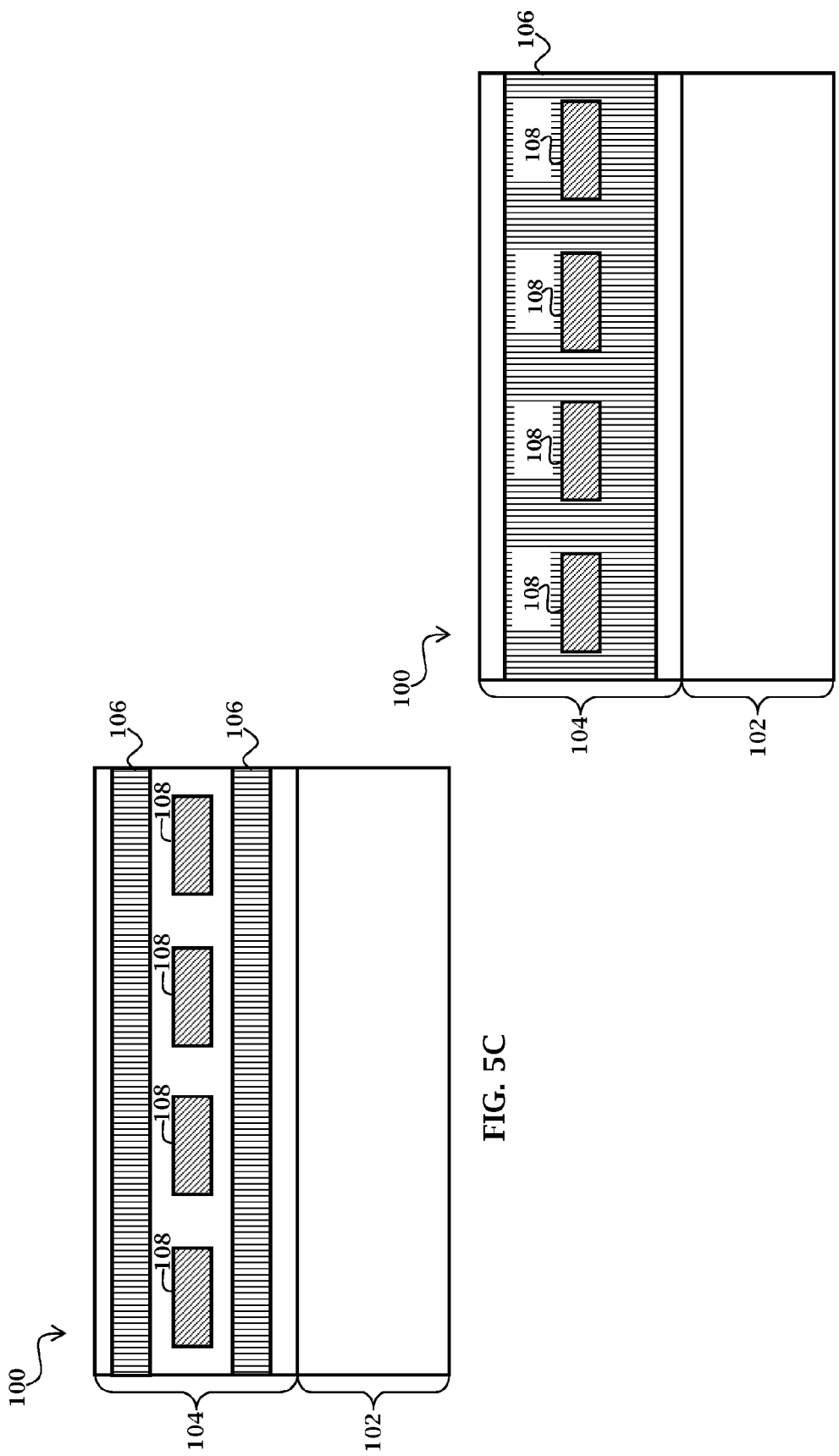

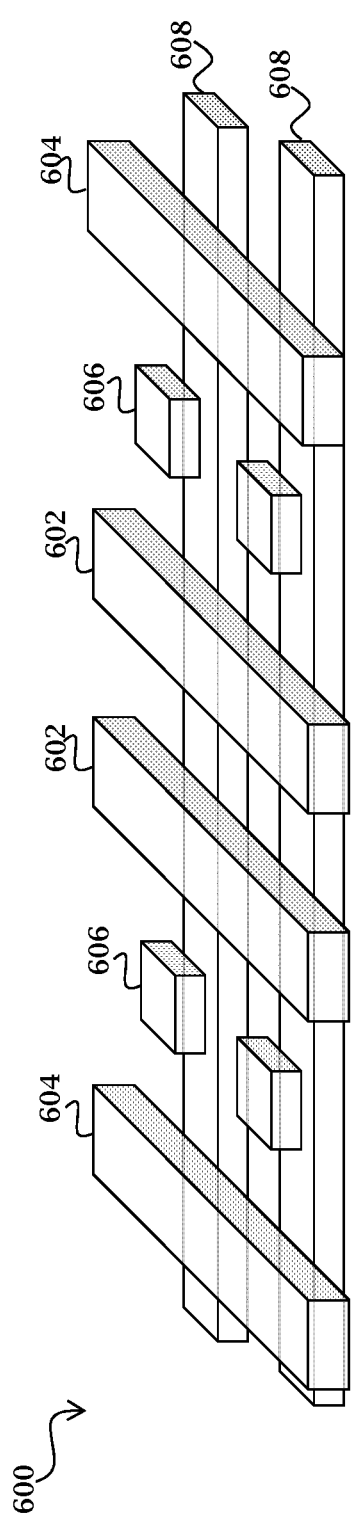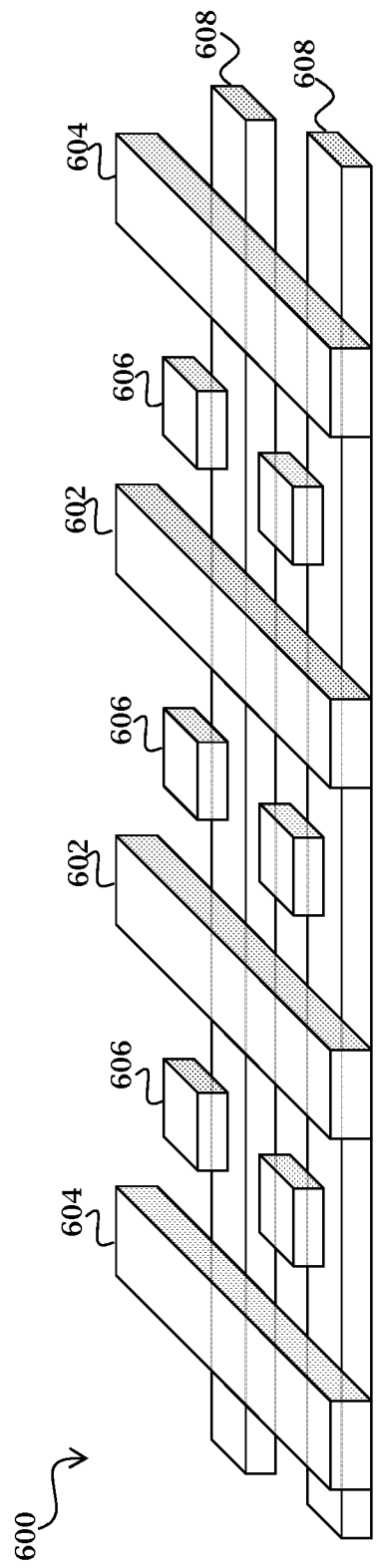
FIG. 10A
FIG. 10B

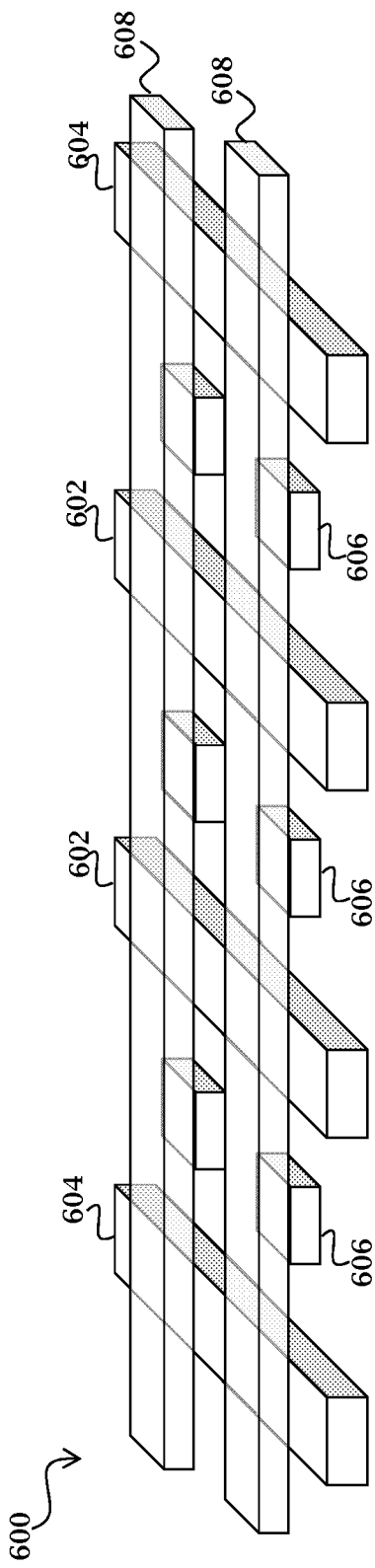
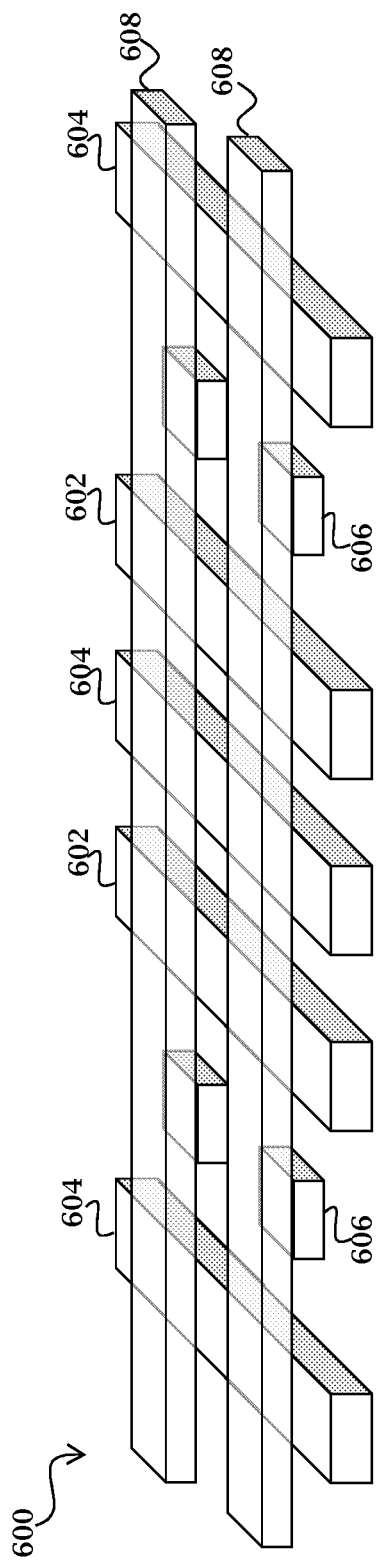
FIG. 10E
FIG. 10F

SLOT-TYPE SHIELDING STRUCTURE HAVING EXTENSIONS THAT EXTEND BEYOND THE TOP OR BOTTOM OF A COPLANAR WAVEGUIDE STRUCTURE

CROSS-REFERENCE TO RELATED APPLICATIONS

This application is a continuation application of U.S. patent application Ser. No. 12/400,133, filed Mar. 9, 2009, now abandoned, the entire disclosure of which is herein incorporated by reference. The entire disclosure of U.S. patent application Ser. No. 12/023,184 filed on Jan. 31, 2008, entitled "Transmitting Radio Frequency Signal in Semiconductor Structure," now U.S. Pat. No. 8,193,880 issued Jun. 5, 2012, which is related hereto and commonly assigned herewith, is hereby incorporated by reference.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down has also emphasized the importance of managing the transmission of radio frequency signals within such ICs. Coplanar waveguide (CPW) structures are often utilized for such transmission, however, it has been observed that conventional CPW structure performance degrades as the transmission frequency increases. Particularly, the performance of conventional CPW structures is less than desirable as electromagnetic wavelength increases. For example, the electromagnetic wavelength in a $SiO_2$ dielectric material is 3000 μm at 50 GHz, which is area-consuming for the application of impedance matching networks of quarter-wavelength long transmission lines. Also, conventional CPW structures currently provide no shield between a signal line and an underlying substrate, and low-loss CPW structures on a silicon substrate are designed and optimized using a thick dielectric layer, which conflicts with advanced CMOS processing. Accordingly, what is needed is a device that addresses the above stated issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-3D and 4A-4C illustrate top views of a coplanar waveguide structure according to various embodiments.

FIGS. 5A-5D illustrate a transverse cross-sectional view of a device including a coplanar waveguide structure according to various embodiments.

FIGS. 6A-6C, 7A-7D, 8A-8F, 9A-9D, and 10A-10F illustrate perspective views of a coplanar waveguide structure according to various embodiments.

DETAILED DESCRIPTION

Figure 1A:
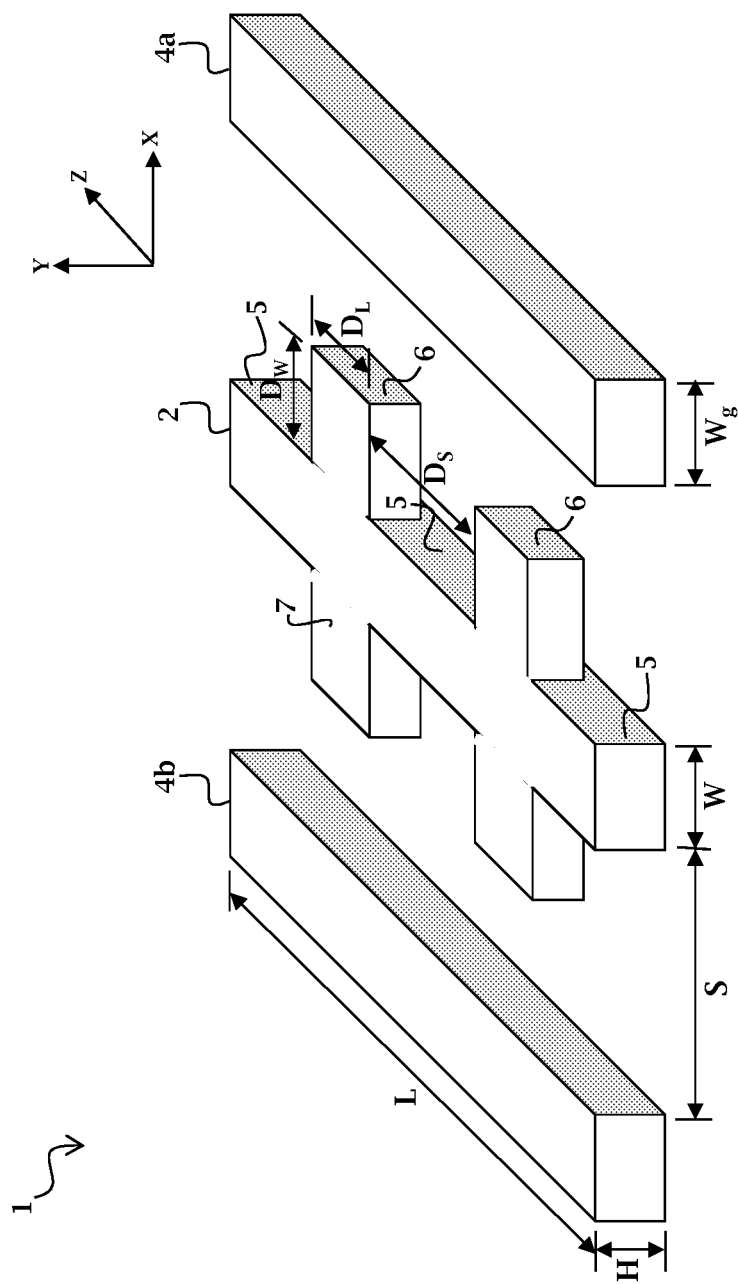
FIGS. 1A-1C illustrate a perspective view, a top view, and an equivalent circuit of an embodiment of a coplanar waveguide structure, respectively.

The present disclosure relates generally to devices including coplanar waveguide structures, and more particularly, to devices including coupled coplanar waveguide structures.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over, above, below, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, alternative embodiments are discussed herein that may not be specifically illustrated in the accompany figure(s). Discussions of alternative embodiments that omit reference numerals are intended to illustrate embodiments that may not be specifically shown in the referenced figure(s).

FIG. 1A illustrates a perspective view of one embodiment of a coplanar waveguide structure 1. The coplanar waveguide structure 1 comprises one or more conductor lines 2, 4a, 4b. In the present embodiment, the conductor line 2 is a signal line. The signal line 2 lies between the one or more conductor lines 4a, 4b. The one or more conductor lines 4a, 4b are relatively static lines (collectively referred to as relatively static lines 4). The signal line 2 may be coupled to a wave source. The wave source may be any suitable frequency. For example, the wave source may include a radio frequency signal source and/or consumer, such as a transmitter, a transceiver, or an antenna. In some embodiments, the signal line 2 carries a radio frequency signal along its length. In some embodiments, the signal line may be designed to carry a radio frequency signal in the microwave and/or millimeter range (for example, frequencies between about 300 MHz and about 300 GHz). In the present embodiment, the relatively static lines 4 may be electrically coupled to ground, and thus, the relatively static lines 4 may also be referred to as ground lines. In some embodiments, one or more of the relatively static lines 4 may be coupled to an AC or DC voltage source, including a reference voltage source.

Signal line 2 is composed of any material capable of propagating a radio frequency signal. Ground lines 4 are composed of any material capable of shielding. For example, the signal line 2 and/or ground lines 4 may comprise metal, such as aluminum, copper, tungsten, titanium, tantulum, titanium nitride, tantalum nitride, nickel silicide, cobalt silicide, silver, TaC, TaSiN, TaCN, TiAl, TiAlN, metal alloys, other suitable materials, and/or combinations thereof. It is understood that the signal line 2 may comprise the same or different material as the ground lines 4, and the ground line 4a may comprise the same or different material as the ground line 4b. In some embodiments, a region between the signal lines 2 and the ground lines 4 may comprise a dielectric or other suitable material.

Signal line 2 and ground lines 4 are oriented substantially parallel to one another in a longitudinal direction. Signal line 2 and ground lines 4 extend longitudinally a substantially uniform distance L, and signal line 2/ground lines 4 have a substantially uniform height H. In some embodiments, signal line 2/ground lines 4 may extend longitudinally varying distances L, and signal line 2/ground lines 4 may have varying heights H. For example, in some embodiments, the signal line 2 may extend a first distance, and the ground lines 4 may extend a second distance. In some embodiments, the ground line 4a may extend a first distance and ground line 4b may extend a second distance. The foregoing examples apply equally to the height H for the signal line 2 and ground lines 4. Each ground line 4 has a width $W_g$. The ground line width $W_g$ may be the same or different for each ground line 4. For example, ground lines 4a, 4b may be equally wide (i.e., ground line 4a width $W_g$=ground line width 4b $W_g$). Ground lines 4 may be wider than they are high (i.e., $W_g$>H), higher than they are wide (i.e., $W_g$<H), square ($W_g$=H), or combinations thereof.

As shown in FIG. 1A, the dimensions of the signal line 2 varies along a longitudinal axis (in the present embodiment, a z-axis). Also illustrated is the x-axis (also referred to as X-axis or horizontal) and y-axis (also referred to as Y-axis or vertical). The variation in dimensions of the signal line 2 forms a periodic structure in the signal line 2. More specifically, the signal line 2 includes alternating segments, a first segment 5 and a second segment 6, which form the periodic structure. The first segment 5 comprises a width W and a length $D_S$. The second segment 6 extends outwardly, horizontally on either side of the signal line 2 towards ground lines 4, making the second segment 6 wider than the first segment 5. The second segment 6, extending outwardly, may form a rectangular shape. Alternatively, a second segment may be an elliptical shape, a semi-circular shape, a triangular shape, other suitable shape, and/or combinations thereof. In the present embodiment, the second segment 6 forms a rectangular shape having a length $D_L$ and a width $D_W$. It is understood that the second segment 6 may have different dimensions. It is further understood that, in some embodiments, the second segment 6 may extend inwardly, horizontally on either side of the signal line 2 towards the center of signal line 2. In some embodiments, the second segment 6 may extend from only one side of the signal line 2.

The periodic structure in signal line 2, formed by alternating first segments 5 and second segments 6, repeats with a period of lengths $D_S+D_L$. In other embodiments, a signal line may have a nonperiodic structure, or it may have a structure that includes more or fewer segments. The dimensions of the coplanar waveguide structure 1 may be selected to provide a desired signal characteristic, for example, a desired phase velocity as described below. In some embodiments, the dimensions width W, and lengths $D_S$, $D_L$, and $D_W$ as illustrated in FIG. 1A, may each be between about 0.1 μ.m and about 8 μm.

The electrical and radio frequency characteristics of the coplanar waveguide structure I will now be described by making reference to FIGS. 1B and 1C. Using distributed circuit theory, the coplanar waveguide structure 1 may be modeled using a series of equivalent circuits. For each differential unit length dz (or dZ) in FIG. 1B, the coplanar waveguide structure 1 may be treated as if it were comprised of an equivalent circuit, such as the equivalent circuit illustrated in FIG. 1C. The equivalent circuit has an inductance per unit length L including components nLdz and Cdz/n and a capacitance per unit length C including components Ldz/n and ndzC. The equivalent circuit may also have a resistance per unit length R and a conductance per unit length G, not depicted herein. Thus, the coplanar waveguide structure 1 may be described using line parameters based on electric circuit concepts. The Figures illustrate V(z) or V(z+dz) is a voltage as a function of position on z-axis or (z+dz), I(z) or I (z+dz) is a current as a function of position on the z-axis (z) or (z+dz); and n providing the number of units.

The values of L (inductance), R (resistance), C (capacitance), and G (conductance) may be determined from the physical characteristics of the coplanar waveguide structure, including its physical dimensions and material composition. The phase velocity $V_p$ of a wave traveling along the signal line may be expressed as:

$$V_p = \frac{c}{\sqrt{\varepsilon_r \mu_r}} = \frac{1}{\frac{n}{2\sqrt{LC}}}$$

where c is the speed of light, $\varepsilon_r$ is the relative permittivity, and $\mu_r$ is the relative permeability. Thus, to design a coplanar waveguide structure to have a desired phase velocity $V_p$, the materials for the coplanar waveguide may be chosen to provide a desired relative permittivity $\varepsilon_r$ and permeability $\mu_r$. Alternately, the coplanar waveguide structure may be dimensioned to provide the desired inductance L and capacitance C using the structures disclosed herein.

Figure 1C:
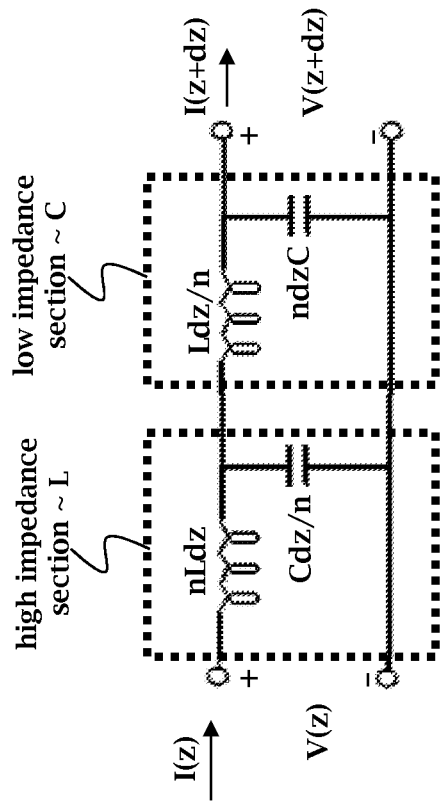
Figure 1B:
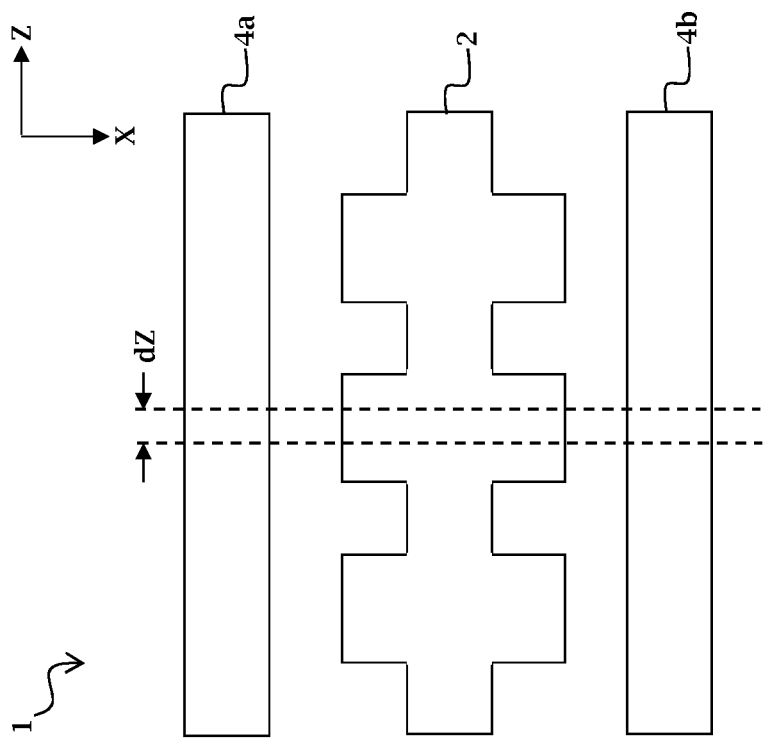

In the present embodiment, the periodic structure, comprising alternating segments 5, 6, provides alternating respective high and low impedance sections as illustrated in the equivalent circuit shown in FIG. 1C. If the alternating high and low impedance sections are short in length compared to the wavelength, and the alternating segments are cascaded together, the inductance is dominated by the high impedance section, and the capacitance is dominated by the low impedance section. For example, if the wavelength is approximately 3000 μm at a frequency of about 50 GHz, and the periodical structure comprises a period of about a few micrometers (i.e., the period is short compared to the wavelength), the present embodiment provides a higher permittivity epsilon $\varepsilon_r$ and lower phase velocity speed $V_p$ as compared to conventional coplanar waveguide structures. The periodical structure within the signal line 2 essentially provides the ability to have a higher permittivity epsilon and adjust the wavelength. Accordingly, the permittivity epsilon $\varepsilon_r$ can be varied by different coplanar waveguide structures, such as the various embodiments presented herein. Such higher epsilon coplanar waveguide structures may be incorporated into microwave and millimeter wave integrated circuits, such as circuit impedance matching circuits of the quarter wavelength long transmission line, GPS satellite systems, greater than 2 GHz PDA cell phones, and UWB wireless communication.

Figure 2:
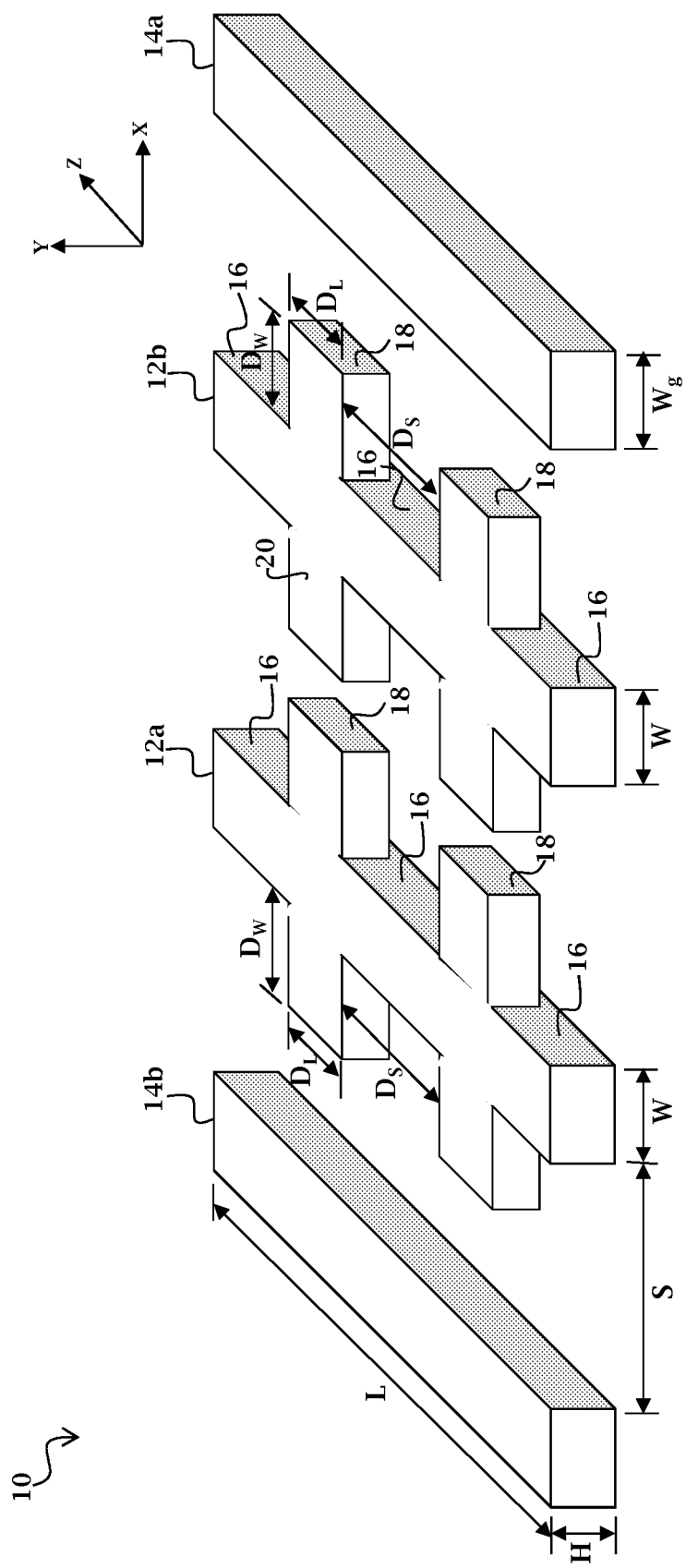
FIG. 2 illustrates a perspective view of an embodiment of a coplanar waveguide structure.

The following discussion provides various coplanar waveguide structures that may provide a higher permittivity epsilon $\varepsilon_r$ and result in an adjusting wavelength. FIG. 2 illustrates a perspective view of one embodiment of a coplanar waveguide structure 10. The coplanar waveguide structure 10 comprises one or more conductor lines 12a, 12b, 14a, 14b. In the present embodiment, the one or more conductor lines 12a, 12b are signal lines (collectively referred to as signal lines 12). The signal lines 12 lie between the one or more conductor lines 14a, 14b. The one or more conductor lines 14a, 14b are relatively static lines (collectively referred to as relatively static lines 14).

The signal lines 12 may be coupled to a wave source. The wave source may be any suitable frequency. For example, the wave source may include a radio frequency signal source and/or consumer, such as a transmitter, a transceiver, or an antenna. In some embodiments, the signal lines 12 carry a radio frequency signal along their length. In some embodiments, the signal lines may be designed to carry a radio frequency signal in the microwave and/or millimeter range (for example, frequencies between about 300 MHz and about 300 GHz). In the present embodiment, the relatively static lines 14 may be electrically coupled to ground, and thus, the relatively static lines 14 may also be referred to as ground lines. In some embodiments, one or more of the relatively static lines 14 may be coupled to an AC or DC voltage source, including a reference voltage source.

Signal lines 12 are composed of any material capable of propagating a radio frequency signal. Ground lines 14 are composed of any material capable of shielding. For example, the signal lines 12 and/or ground lines 14 may comprise metal, such as aluminum, copper, tungsten, titanium, tantalum, titanium nitride, tantalum nitride, nickel silicide, cobalt silicide, silver, TaC, TaSiN, TaCN, TiAl, TiAlN, metal alloys, other suitable materials, and/or combinations thereof. It is understood that the signal lines 12 may comprise the same or different material as the ground lines 14, the signal line 12a may comprise the same or different material as the signal line 12b, and the ground line 14a may comprise the same or different material as the ground line 14b. Regions between the signal lines 12 and ground lines 14 may be insulating regions, low-k dielectric regions, high-k dielectric regions, other suitable dielectric regions, other suitable regions, and/or combinations thereof. In some embodiments, the regions between the signal lines 12 and the ground lines 14 may comprise a dielectric or other suitable material. In some embodiments, the regions between the signal lines 12 and ground lines 14 may comprise varying materials and/or compositions.

Signal lines 12 and ground lines 14 are oriented substantially parallel to one another in a longitudinal direction. Signal lines 12 and ground lines 14 extend longitudinally a substantially uniform distance L, and signal lines 12/ground lines 14 have a substantially uniform height H. In other embodiments, signal lines/ground lines may extend longitudinally varying distances L, and signal lines/ground lines may have varying heights H. For example, in some embodiments, the signal lines may extend a first distance, and the ground lines may extend a second distance. In some embodiments, a first signal line (similar to 12a) may extend a first distance, and second signal line (similar to 12b) may extend a second distance. The foregoing examples apply equally to the height H for the signal lines and ground lines. Further, each signal line 12a, 12b is a distance S from a ground line 14a, 14b. The distance S may be any suitable distance. Each ground line 14 has a width $W_g$. The ground line width $W_g$ may be the same or different for each ground line 14. For example, ground lines 14a, 14b may be equally wide (i.e., ground line 14a width $W_g$=ground line 14b width $W_g$). Ground lines 14 may be wider than they are high (i.e., $W_g$>H), higher than they are wide (i.e., $W_g$<H), square ($W_g$=H), or combinations thereof.

The dimensions of the signal lines 12 vary along a longitudinal axis (in the present embodiment, a z-axis). The variation in dimensions of the signal lines 12 form a periodic structure in the signal lines 12. More specifically, the signal lines 12 include alternating segments, a first segment 16 and a second segment 18, which form the periodic structure. The first segment 16 comprises a width W and a length $D_S$. The width W may be the same or different for each signal line 12. For example, the first segments 16 of signal lines 12a, 12b may be equally wide (i.e., signal line 12a width W=signal line 12b width W). The second segment 18 extends outwardly, horizontally on either side of the signal lines 12 towards ground lines 14, making the second segment 18 wider than the first segment 16. The second segment 18, extending outwardly, may form a rectangular shape. Alternatively or additionally, a second segment may form an elliptical shape, a semi-circular shape, a triangular shape, other suitable shape, and/or combinations thereof. In the present embodiment, the second segment 18 forms a rectangular shape having a length $D_L$ and a width $D_W$. It is understood that a second segment may have different dimensions. It is further understood that, in some embodiments, a second segment may extend inwardly, horizontally on either side of a signal line such as signal lines 12 and towards the center of a signal line such as signal lines 12. In some embodiments, a second segment may extend from only one side of a signal line such as the signal lines 12. In some embodiments, a first segment may be wider than a second segment.

In FIG. 2, the periodic structure in signal line 12, formed by alternating first segments 16 and second segments 18, repeats with a period of length $D_S+D_L$. In other embodiments, a signal line may have a nonperiodic structure, or it may have a structure that includes more or fewer segments. As noted above, the periodic structures in the signal lines 12 provide a higher permittivity epsilon and result in an adjusting wavelength. Accordingly, the dimensions of the coplanar waveguide structure 10 may be selected to provide a desired signal characteristic, for example, a desired phase velocity as described above. In some embodiments, the dimensions W, $D_S$, $D_L$, and $D_W$ (as illustrated in FIG. 2) may each be between about 0.1 μm and about 8 μm.

Figure 3B:
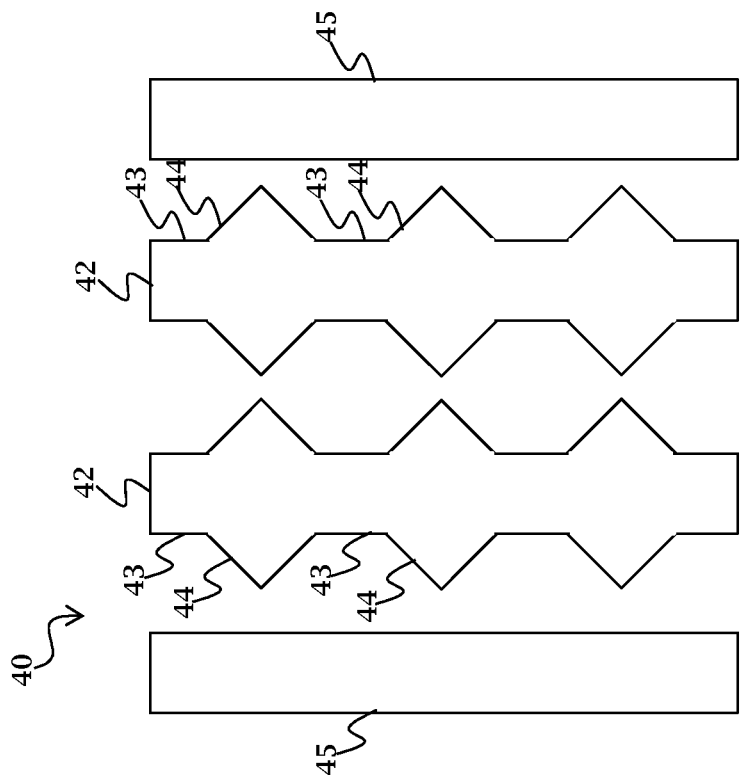
Figure 3A:
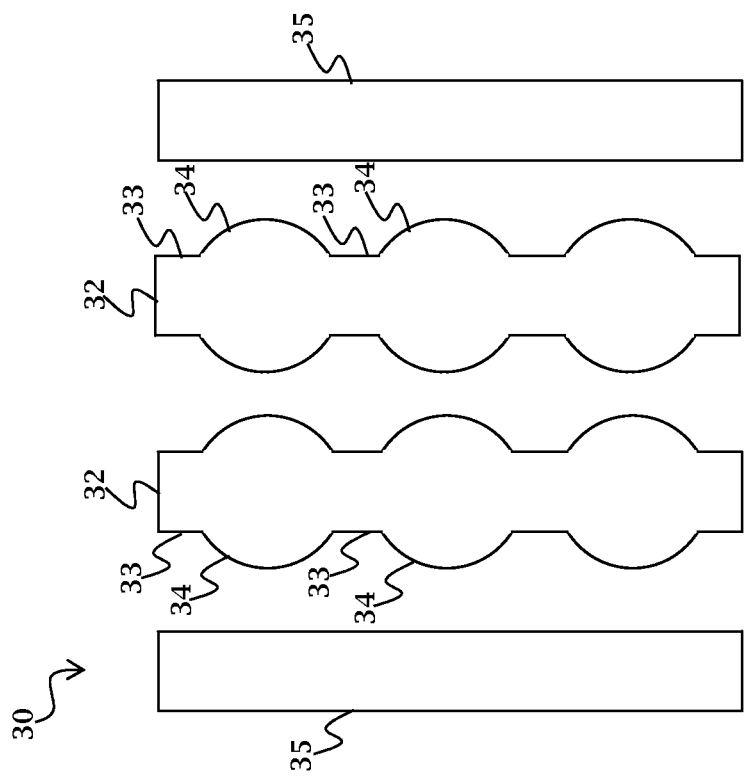

The signal lines 12 and ground lines 14 of coplanar waveguide structure 10 may comprise any suitable configuration, wherein the configuration provides a periodic structure. For example, FIGS. 3A-3D and FIGS. 4A-4C illustrate top views of various embodiments of coplanar waveguide structures comprising periodic structures. For example, FIG. 3A illustrates a coplanar waveguide structure 30 comprising signal lines 32 similar to the signal lines 12 described above. The signal lines 32 include alternating segments, first segments 33 and second segments 34. The second segments 34 are wider than the first segments 33 and extend outwardly in a semi-circular shape toward ground lines 35. As noted above, other shapes for first and second segments forming the periodic structure in the signal lines are also possible. For example, FIG. 3B illustrates another embodiment of a coplanar waveguide structure 40 comprising signal lines 42 with first segments 43 and second segments 44. The second segments 44 extend outwardly toward ground lines 45, providing second segments 44 with generally triangular-shaped extensions.

In some embodiments, the ground lines may include a periodic structure or otherwise irregular shaped structure. For example, FIG. 3C illustrates a coplanar waveguide structure 50 comprising signal lines 52 similar to signal lines 12 described above. The signal lines 52 include alternating segments, first segments 53 and second segments 54, that extend outwardly toward ground lines 55a, 55b to form rectangular-shaped extensions. The second segments 54 are wider than the first segments 53. The ground lines 55a, 55b are substantially uniform in width. The ground lines 55a, 55b include a first portion 56 where the distance between the signal lines 52 and the ground lines 55a, 55b is relatively small, and a second portion 57 where the distance between the signal lines 52 and the ground lines 55a, 55b is relatively large. Although the distance between the signal lines 52 and the ground lines 55a, 55b varies, the signal lines 52 and the ground lines 55a, 55b are oriented in a same direction and are substantially parallel. FIG. 3C illustrates the first portions of ground lines 55a, 55b as coinciding at a longitudinal position along the length of the coplanar waveguide structure 50. The second portions of ground lines 55a, 55b are similarly depicted as coinciding. That is, the ground line 55a is a substantially mirror image of the ground line 55b reflected across a plane that bisects the signal line lengthwise. However, in other embodiments, a first portion of a first ground line may coincide with a second portion of a second ground line. That is, a first ground line may be a substantially mirror image of a second ground line that has been longitudinally shifted. In still other embodiments, a first ground line may have a form that is unrelated to the form of a second ground line. Furthermore, although FIG. 3C illustrates ground lines 55a, 55b as having curved sides, the sides of ground lines may also be square, angled, or any other shape or combination of shapes.

In another example, FIG. 3D illustrates a coplanar waveguide structure 60 comprising signal lines 62 similar to signal lines 12 described above. The signal lines 62 include alternating segments, first segments 63 and second segments 64, that extend outwardly toward ground lines 65 to form semi-circular shaped extensions. The second segments 64 are wider then the first segments 63. The ground lines 65 comprise one or more segments 66 that have a substantially similar cross-sectional shape. In the present embodiment, the one or more segments 66 are coupled to one another by an interconnect that may be in the same or a different layer, wherein the interconnect may be a metal interconnect. The one or more segments may comprise any suitable material. For example, in some embodiments, the segments 66 may comprise two or more different materials, such as one or more of the segments 66 comprising a conductive material and one or more of the segments 66 comprising nonconductive material. In some embodiments, the segments may be composed of the same material as the signal lines 62.

It is understood that various aspects of the coplanar waveguide structures disclosed herein may be combined in a single coplanar waveguide structure. For example, FIGS. 4A-4C show coplanar waveguide structures 70, 80, 90 comprising one or more signal lines 72, 82, 92 and one or more ground lines 75, 85, 95 having periodic structures similar to the signal lines and ground lines described above. Referring to FIG. 4A, the signal lines 72 include alternating segments, first segments 73 and second segments 74. The second segments 74 are wider than the first segments 73 and extend outwardly in a semi-circular shape toward ground lines 75. The ground lines 75 also include alternating segments, first segments 76 and second segments 77. The second segments 77 are wider than the first segments 76 and similarly extend outwardly in a semi-circular shape. Referring to FIG. 4B, the signal lines 82 and the ground lines 85 comprise alternating segments, first segments 83, 86 and second segments 84, 87 respectively. The second segments 84, 87 are wider than the first segments 83, 86 and extend outwardly in a triangular shape. Referring to FIG. 4C, the signal lines 92 and the ground lines 95 comprise alternating segments, first segments 93, 96 and second segments 94, 97 respectively. The second segments 94, 97 are wider than the first segments 93, 96. The second segments 94 of the signal lines 92 extend outwardly in a semi-circular shape, and the second segments 97 of the ground lines 95 extend outwardly in a triangular shape.

Referring now to FIGS. 5A-5D, a transverse cross-sectional view of a device 100 including a coplanar waveguide structure according to one embodiment is illustrated. The device 100 includes a lower substrate 102 and an upper substrate 104 including one or more low-k dielectric layers 106 and coplanar waveguide portions 108.

The lower substrate 102 may comprise any suitable material and any suitable thickness. In the present embodiment, the lower substrate 102 comprises a semiconductor substrate, such as a silicon substrate. The lower substrate 102 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the substrate may be a semiconductor on insulator (SOI) or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure. In some embodiments, the lower substrate 102 may comprise glass.

The lower substrate 102 may include multiple layers comprising the same or varying materials. The lower substrate 102 may further include various doping configurations depending on design requirements as known in the art (e.g., p-type substrate regions or n-type substrate regions). In some embodiments, the lower substrate 102 may include doped regions. It is understood that the lower substrate 102 may comprise partially or fully fabricated devices, structures, and or features known in the art, including but not limited to gate structures, source/drain regions, lightly doped regions, shallow trench isolations, transistors, diodes, vias, trenches, various contacts/vias and multilayer interconnect features (e.g., metal layers and interlayer dielectrics), other features, and/or combinations thereof.

The upper substrate 104 may comprise any suitable material and any suitable thickness. The upper substrate 104 may comprise one or more insulating layers. In the present embodiment, the upper substrate 104 comprises a dielectric material, such as tetraethyl orthosilicate (TEOS) oxide, silicon oxide, silicon nitride, silicon oxynitride, hafnium oxide, zirconium oxide, titanium oxide, aluminum oxide, hafnium dioxide-alumina ($HfO_2$—$Al_2O_3$) alloy, phosphosilicate glass (PSG), borophosphosilicate glass (BPSG), other suitable dielectric materials, and/or combinations thereof. In some embodiments, the upper substrate 104 may comprise a high-k dielectric material, which may include metal oxides, metal nitrides, metal silicates, transition metal-oxides, transition metal-nitrides, transition metal-silicates, oxynitrides of metals, metal aluminates, zirconium silicate, zirconium aluminate, $HfO_2$, HfSiO, HfSiON, HfTaO, HfTaTiO, HfTiO, HfZrO, HfAlON, other suitable high-k dielectric materials, and/or combinations thereof In some embodiments, the upper substrate may comprise a low-k dielectric material, such as fluorinated silica glass (FSG), carbon doped silicon oxide, BLACK DIAMONDS® (Applied Materials of Santa Clara, California) including comparable low-k dielectric material, xerogel, aerogel, amorphous fluorinated carbon, PARYLENE including comparable low-k coating material, BCB (bis-benzocyclobutenes), SILK™ (Dow Chemical, Midland, Michigan) including comparable low-k polymer material, polyimide, other proper porous polymeric materials, and/or combinations thereof.

It is understood that the upper substrate 104 may include a multilayer structure, wherein each layer comprises the same or varying materials, such as varying dielectric and metal materials. It is further understood that additional layers may be formed overlying and/or underlying the upper substrate 104. In the present embodiment, the upper substrate 104 includes the one or more low-k dielectric layers 106 and coplanar waveguide portions 108. The one or more low-k dielectric layers 106 may comprise any suitable dielectric material, such as the materials described above and/or dielectric materials with a dielectric constant of less than about 3.9. The one or more low-k dielectric layers 106 may comprise any suitable thickness. The one or may low-k dielectric layers 106 and coplanar waveguide portions 108 may be included at any suitable location in the upper substrate 104. For example, the low-k dielectric layer 106 may be formed below the coplanar waveguide portions 108 as illustrated in FIG. 5A, the low-k dielectric layer 106 may be formed above the coplanar waveguide portions 108 as illustrated in FIG. 5B; one or more low-k dielectric layers 106 may be formed above and below the coplanar waveguide portions 108 as illustrated in FIG. 5C; or the coplanar waveguide portions 108 may be formed in the low-k dielectric layer 106 as illustrated in FIG. 5D. Similarly, the coplanar waveguide portions 108 may be included at locations other than those illustrated, and such locations are not limited by FIGS. 5A-5D.

The coplanar waveguide portions 108 collectively form a coplanar waveguide structure. The coplanar waveguide structure may be similar to the coplanar waveguide structures described herein. For example, the coplanar waveguide portions 108 may comprise signal lines and ground lines. In the present embodiment, portions of the upper substrate 104 lie between the coplanar waveguide portions 108; however, it is understood that, in alternate embodiments, other suitable regions may lie between the coplanar waveguide portions, such as insulating regions, low-k dielectric regions, high-k dielectric regions, other suitable dielectric regions, other suitable regions, and/or combinations thereof. The coplanar waveguide portions 108 may comprise any suitable material and any suitable thickness. For example, the coplanar waveguide portions 108 may comprise a metal, such as aluminum, copper, tungsten, titanium, tantulum, titanium nitride, tantalum nitride, nickel silicide, cobalt silicide, silver, TaC, TaSiN, TaCN, TiAl, TiAlN, metal alloys, other suitable materials, and/or combinations thereof.

Figure 6A:
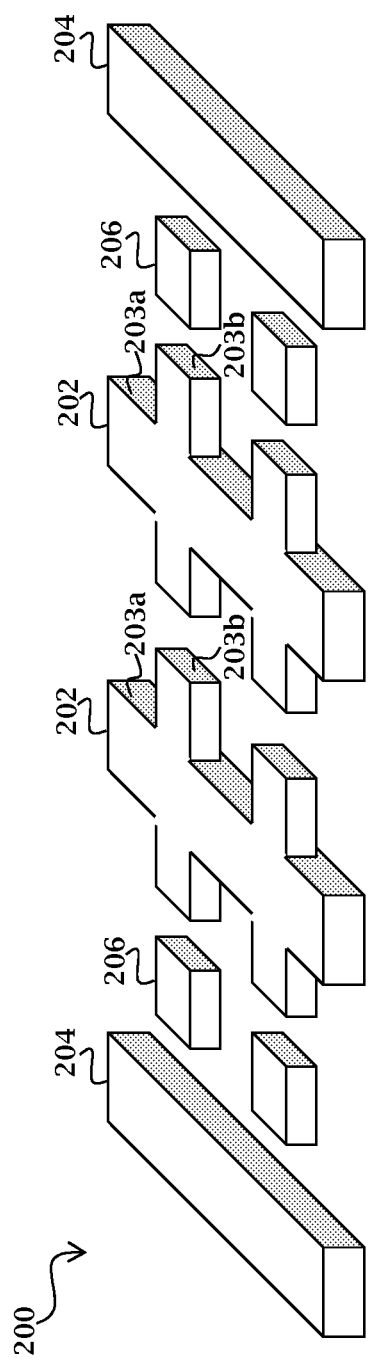
Figure 6B:
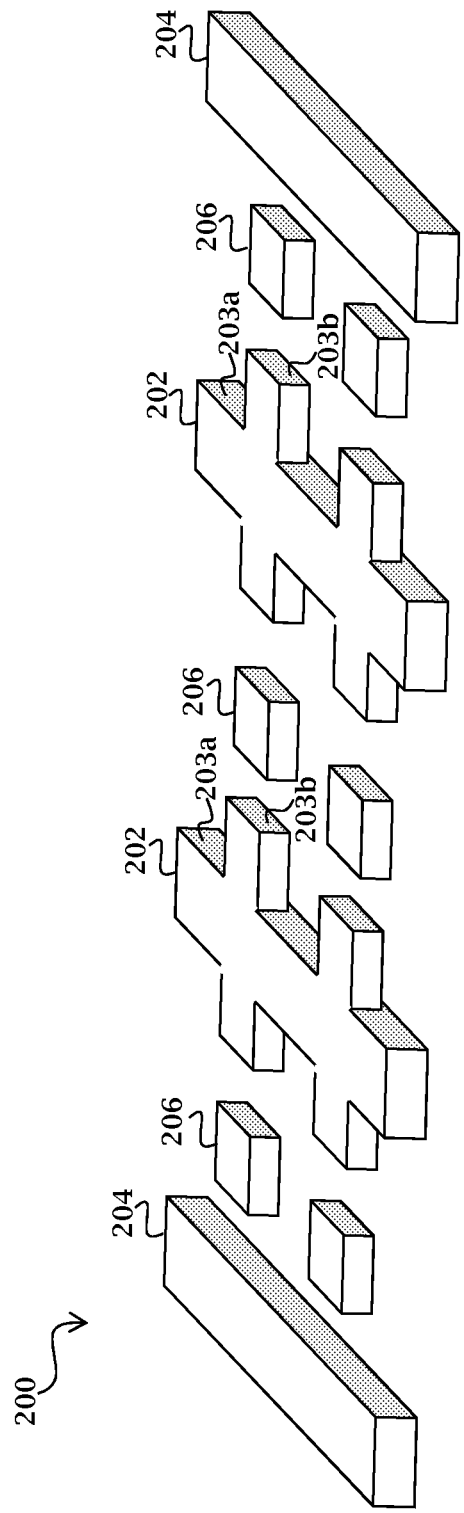
Figure 6C:
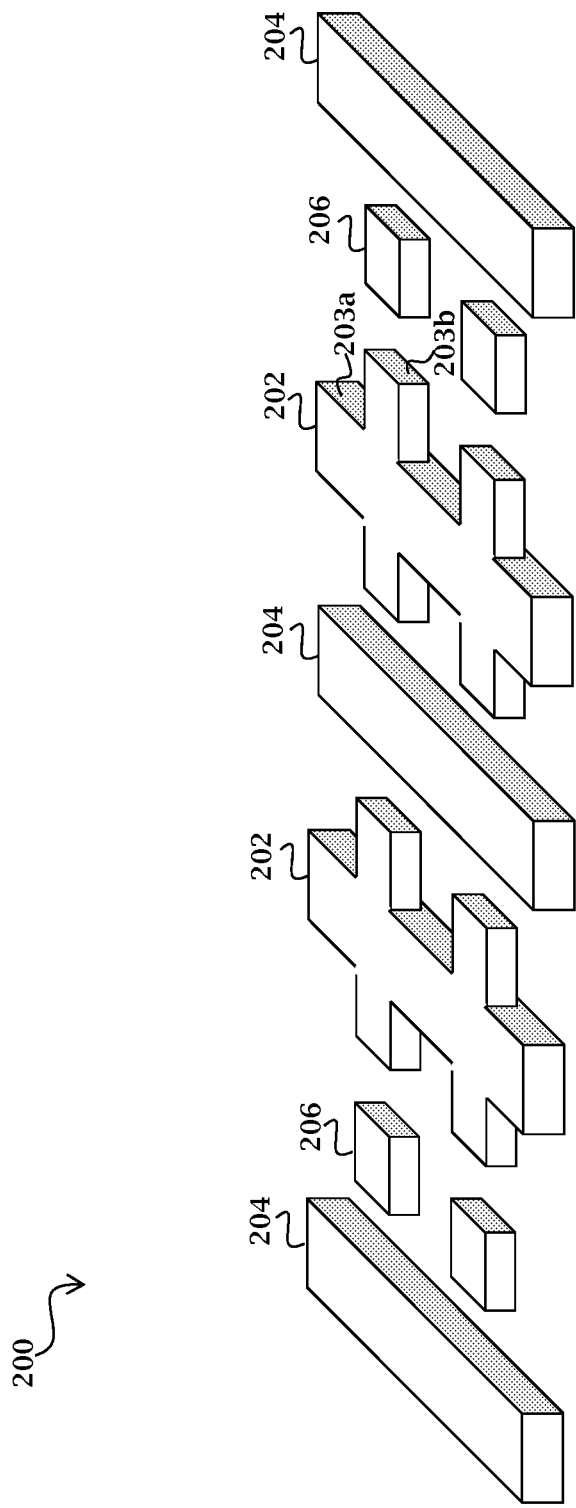

FIGS. 6A-6C show perspective views of various embodiments of a coplanar waveguide structure 200, wherein the coplanar waveguide structure 200 includes one or more islands. Introducing the one or more islands into the coplanar waveguide structure 200 increases the permittivity epsilon and results in an adjusting wavelength. The coplanar waveguide structure 200 comprises one or more signal lines 202, one or more ground lines 204, and one or more islands 206. The signal lines 202 and ground lines 204 are similar to the signal lines and ground lines discussed above. Particularly, the signal lines 202 comprise a periodic structure comprising first segments 203a and second segments 203b, the second segments 203a forming rectangular-shaped extensions. However, it is understood that in other embodiments signal lines may comprise any suitable periodic structure, and each of the signal lines may comprise the same periodic structure, varying periodic structures, or no periodic structure. Referring to FIG. 6A, signal lines 202 are disposed between ground lines 204, and one or more islands 206 are disposed between each of the signal lines 202 and each of the ground lines 204. The islands 206 coincide with the second segments 203b of the periodic structure in signal lines 202. That is, the coplanar waveguide structure 200 has islands 206 at periodic intervals along its length, the signal lines 202 have second segments 203b at periodic intervals along its length (as discussed in further detail above), and the period of the islands 206 is equal to the period of the second segments 203b of the periodic structure in signal lines 202. In some embodiments of waveguide structures, islands may coincide with first segments (similar to segments 203a) of the periodic structure in signal lines. In still other embodiments, the islands may be at intervals that do not correspond to the periodic structure of the signal lines. FIG. 6B is similar to FIG. 6A and additionally includes one or more islands 206 disposed between the signal lines 202 at periodic intervals along the length of the coplanar waveguide structure 200. FIG. 6C is similar to FIG. 6A and additionally includes one or more ground lines 204 disposed between the signal lines 202. It is understood that the coplanar waveguide structure 200 is not limited by FIGS. 6A-6C and may comprise any combination and configuration of signal lines, ground lines, and islands.

The one or more of the islands 206 may be electrically intercoupled and/or electrically isolated from one another; electrically coupled to one or more of the signal lines 202, one or more of the ground lines 204, and/or a reference voltage or signal; completely electrically isolated; and/or combinations thereof. Where one or more islands 206 are electrically coupled, the electrical coupling may be through an interconnect or via. Further, the signal lines 202, ground lines 204, and islands 206 may be any suitable distance from one another. For example, the islands 206 may be closer to the signal lines 202 than to the ground lines 204, closer to the ground lines 204 than to the signal lines 202, or equidistant to the nearest signal line 202 and the nearest ground line 206. In some embodiments, some islands 206 may be closer to the signal lines 202 than some other islands 206. That is, the distance between the signal lines 202 and the islands 206 may vary over the length of the coplanar waveguide structure 200.

In the present embodiment, the islands 206 may be referred to as conductive pillars. The islands 206 may comprise any suitable shape, such as a rectangular shape, a circular shape, an elliptical shape, a triangular shape, other suitable shape, and/or combinations thereof. In some embodiments, the islands 206 comprise quadrilateral frusta, rectangular prisms, elliptic cylinders, circular cylinders, or combinations thereof. Further, the islands 206 may be substantially uniform in form and dimension, or the islands 206 may vary in form, dimension, or both. The islands 206 may have a uniform composition or a varied composition. The islands 206 may comprise any material, such as aluminum, copper, tungsten, titanium, tantulum, titanium nitride, tantalum nitride, nickel silicide, cobalt silicide, silver, TaC, TaSiN, TaCN, TiAl, TiAlN, metal alloys, other suitable materials, and/or combinations thereof. In other embodiments, some or all of the islands 206 may comprise a dielectric material. It is understood that each of the one or more islands 206 may comprise the same material or different materials. Further, the islands 206 may be composed of the same or a different material as the signal lines 202 and/or ground lines 204. In some embodiments, all the islands 206 are composed of the same material as the signal lines 202.

Figure 7A:
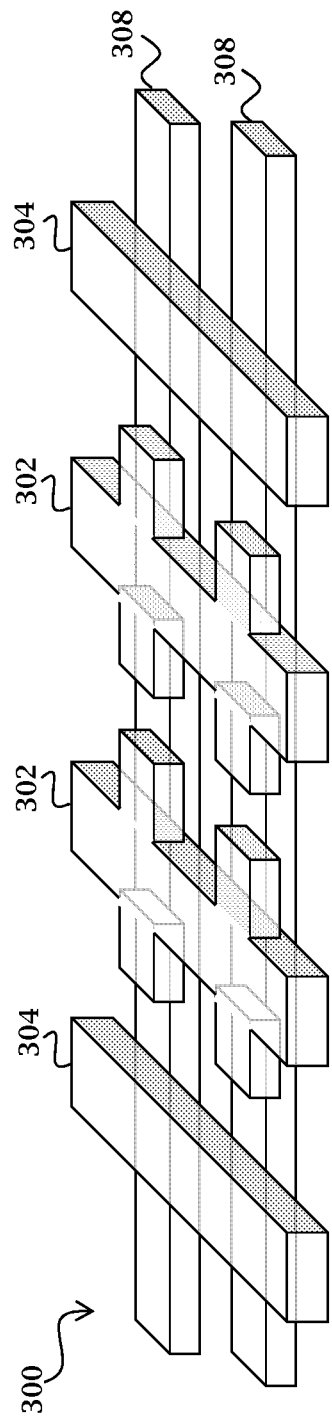
Figure 7B:
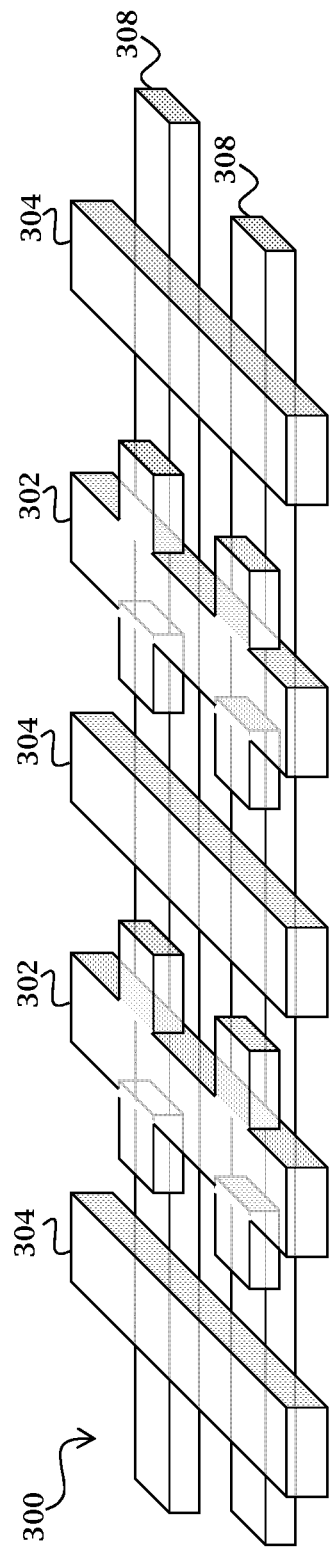
Figure 7C:
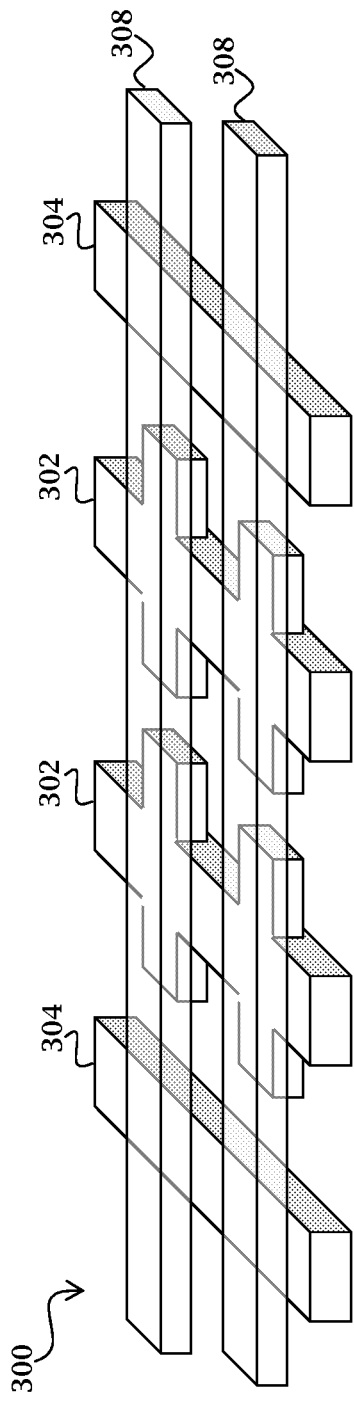
Figure 7D:
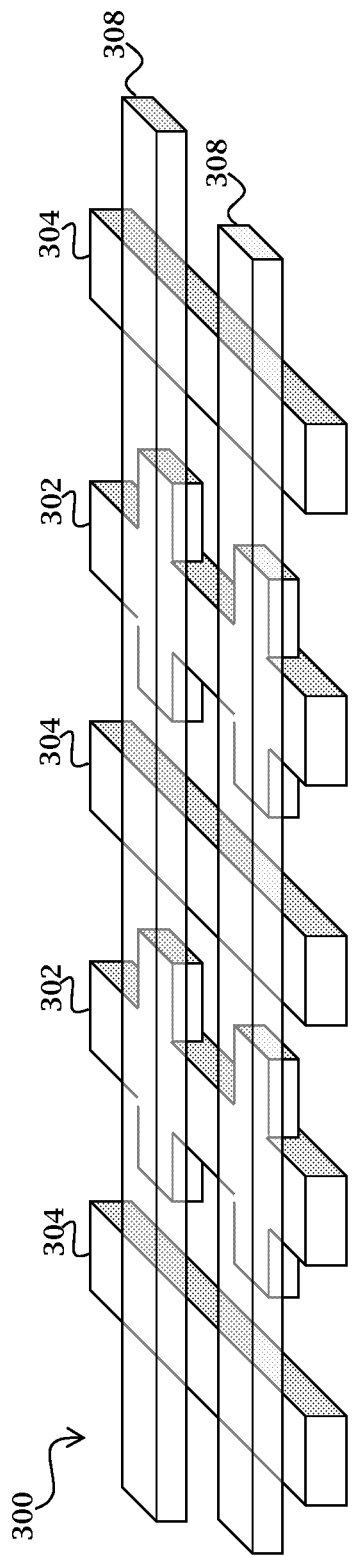

FIGS. 7A-7D show perspective views of various embodiments of a coplanar waveguide structure 300, wherein the coplanar waveguide structure 300 includes one or more floating strips above and/or beneath the signal lines/ground lines including periodic structures. Combining the one or more floating strips with the one or more signal lines/ground lines having periodic structures increases the permittivity epsilon and results in an adjustable wavelength. The coplanar waveguide structure 300 includes a first layer comprising one or more signal lines 302 and one or more ground lines 304 and a second layer comprising one or more floating strips 308. The signal lines 302 and ground lines 304 are similar to the signal lines 12 and ground lines 14 previously described with respect to FIG. 2. Particularly, at least one of the one or more signal lines 302 includes a periodic structure. In other embodiments, at least one of the one or more ground lines includes a periodic structure. The first layer may be separated from the second layer by a dielectric layer or other suitable material. The second layer comprising the one or more floating strips 308 may be located below the first layer comprising the signal lines 302/ground lines 304 as illustrated in FIGS. 7A, 7B. Alternatively, the second layer including the one or more floating strips 308 may be located above the first layer comprising the signal lines 302/ground lines 304 as illustrated in FIGS. 7C, 7D. In some embodiments, a coplanar waveguide structure may include two second layers comprising one or more floating strips, where one floating strip is located above the first layer and another floating strip is located below the first layer. In some embodiments, a coplanar waveguide structure may include multiple second layers comprising one or more floating strips (similar to strips 308) above and/or below the first layer. Regions between the various layers and features of the coplanar waveguide structures may be insulating regions, low-k dielectric regions, high-k dielectric regions, other suitable dielectric regions, other suitable regions, and/or combinations thereof. In some embodiments, the regions between the various layers and features may comprise varying materials and/or compositions.

The floating strips 308 may extend across substantially the entire width of the coplanar waveguide structure 300 or a portion of a width of a coplanar waveguide structure. Further, the floating strips 308 may be at periodic intervals along the length of the coplanar waveguide structure 300. If at such periodic intervals, the floating strips 308 may disposed at any suitable period. The floating strips 308 may comprise any suitable material. In the present embodiment, the floating strips 308 comprise a conductive material, such as aluminum, copper, tungsten, titanium, tantulum, titanium nitride, tantalum nitride, nickel silicide, cobalt silicide, silver, TaC, TaSiN, TaCN, TiAl, TiAlN, metal alloys, other suitable materials, and/or combinations thereof. In some embodiments, the floating strips 308 may comprise one or more layers. In some embodiments, the floating strips 308 may be similar to the conductive strips described in U.S. Pat. No. 7,242,272, entitled "Methods and Apparatus Based on Coplanar Striplines," issued to Ham et al. and/or U.S. Pat. No. 6,950,590, entitled "Transmission Lines and Components with Wavelength Reduction and Shielding," issued to Cheung et al., both of which are hereby incorporated by reference. Further, the one or more of the floating strips 308 may be electrically intercoupled and/or electrically isolated from one another; electrically coupled to one or more of the signal lines 302, one or more of the ground lines 304, and/or a reference voltage or signal; completely electrically isolated; and/or combinations thereof. Where one or more floating strips are electrically coupled, the electrical coupling may be through an interconnect or via.

Figure 8A:
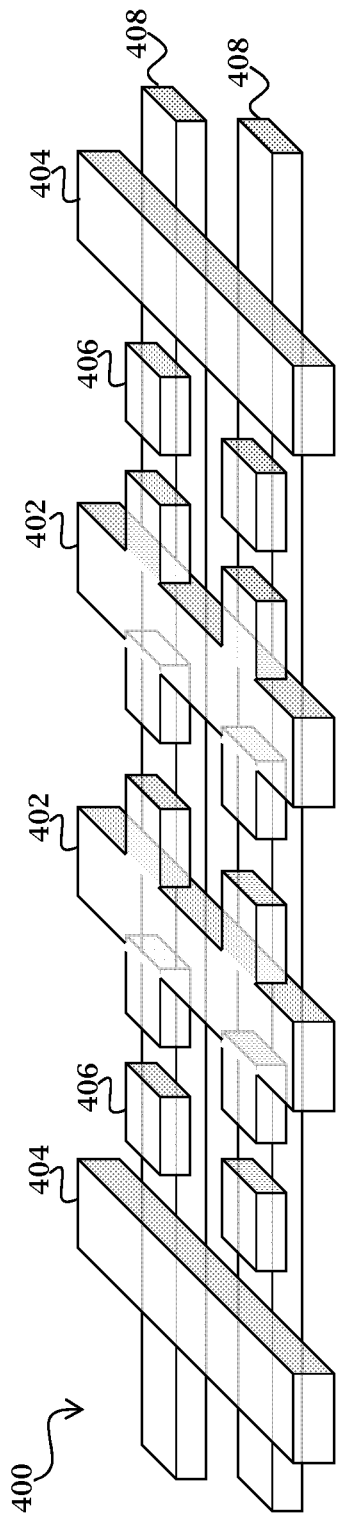
Figure 8B:
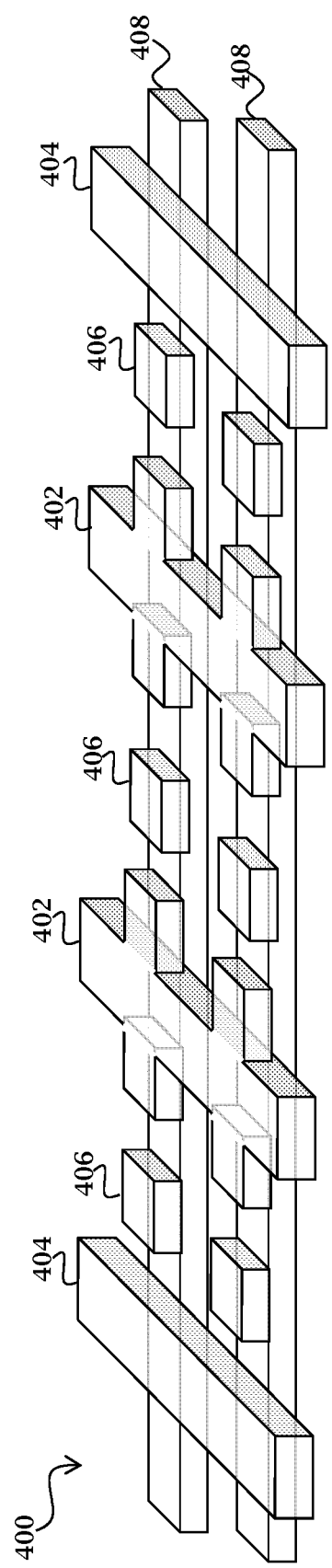
Figure 8C:
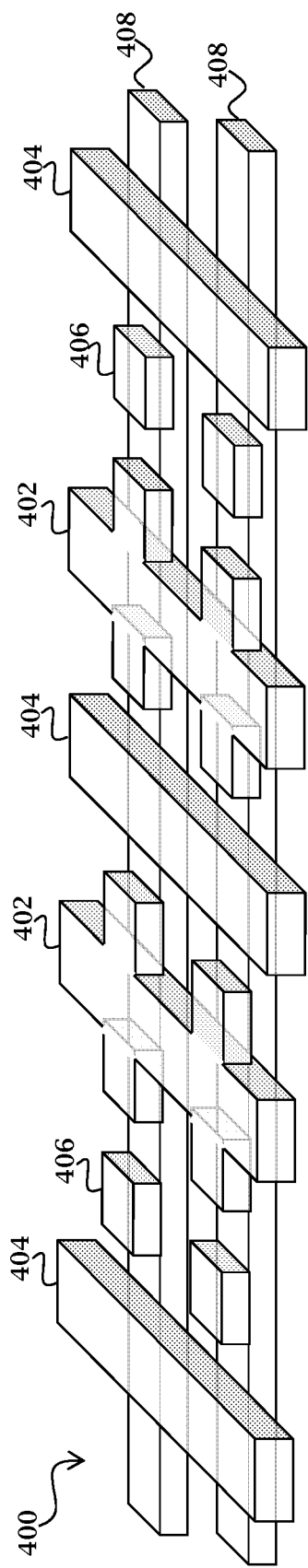
Figure 8D:
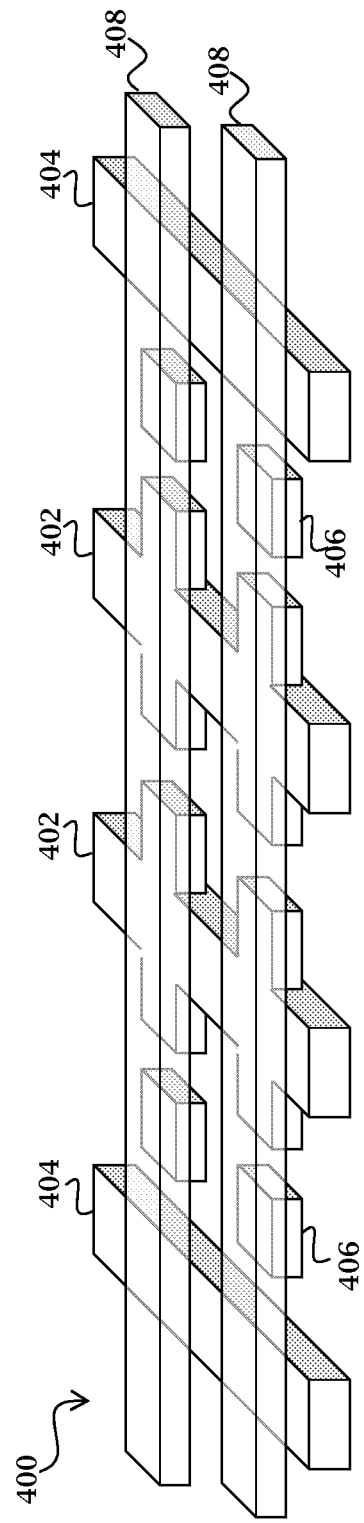
Figure 8E:
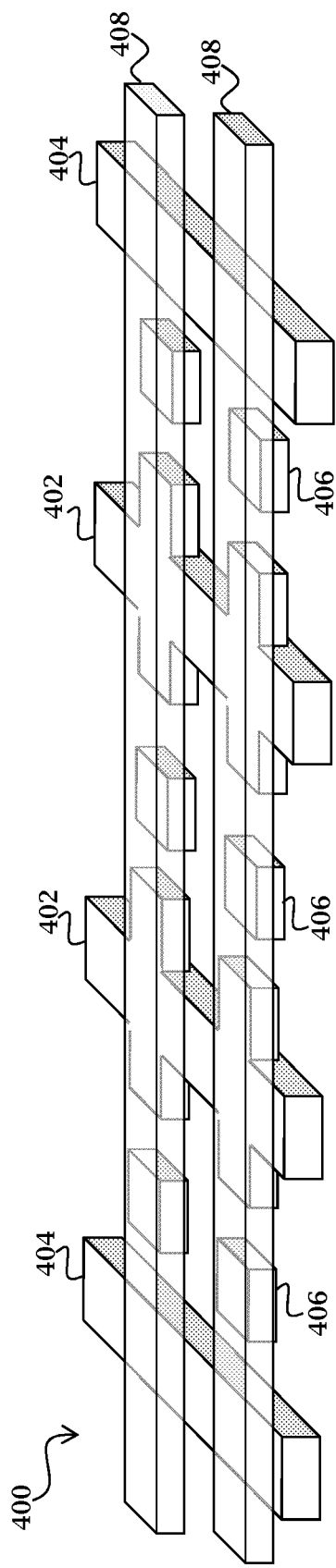
Figure 8F:
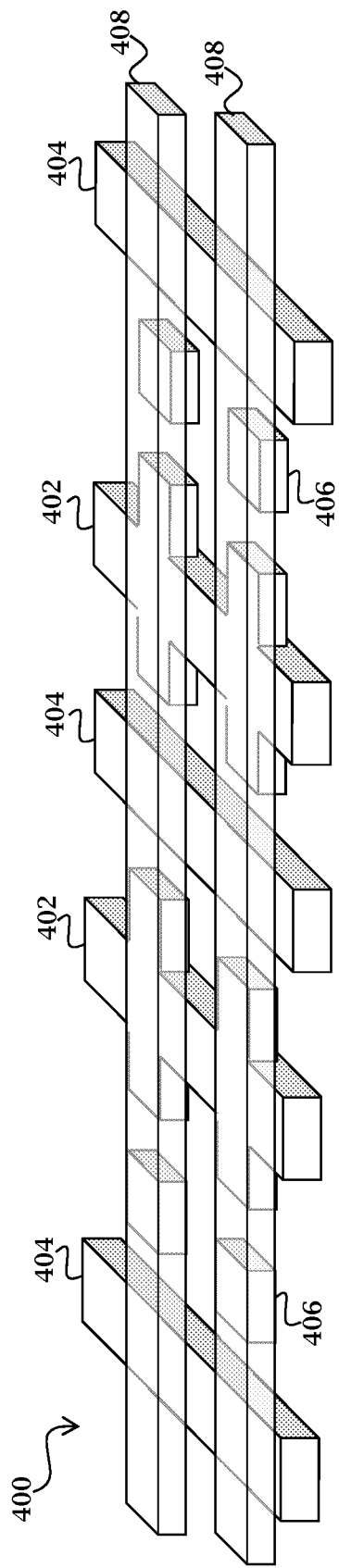

FIGS. 8A-8F show perspective views of various embodiments of a coplanar waveguide structure 400, wherein the coplanar waveguide structure 400 includes one or more floating strips above and/or beneath the signal lines/ground lines including periodic structures and the islands. Combining the one or more floating strips with the one or more signal lines having periodic structures and the islands increases the permittivity epsilon and results in an adjustable wavelength. The coplanar waveguide structure 400 includes a first layer comprising one or more signal lines 402, one or more ground lines 404, and one or more islands 406 and a second layer comprising one or more floating strips 408. The signal lines 402, ground lines 404, islands 406, and floating strips 408 are similar to the signal lines, ground lines, islands, and floating strips previously described with respect to the various embodiments above. Particularly, at least one of the one or more signal lines 402 includes a periodic structure. In some embodiments, at least one of the one or more ground lines includes a periodic structure. The islands 406 and floating strips 408 may be at periodic intervals along the coplanar waveguide structure 400, and the period of the floating strips 408 may be the same as or different than the period of the islands 406. The first layer is separated from the second layer by a dielectric layer. The second layer comprising the one or more floating strips 408 may be located below the first layer comprising the signal lines 402/ground lines 404/islands 406 as illustrated in FIGS. 8A, 8B, 8C or above the first layer comprising the signal lines 402/ground lines 404/islands 406 as illustrated in FIGS. 8D, 8E, 8F. In some embodiments, a coplanar waveguide structure may include two second layers comprising one or more floating strips, one located above the first layer and the other located below the first layer. In some embodiments, a coplanar waveguide structure may include multiple second layers comprising one or more floating strips above and/or below the first layer. Regions between the various layers and features of the coplanar waveguide structure may be insulating regions, low-k dielectric regions, high-k dielectric regions, other suitable dielectric regions, other suitable regions, and/or combinations thereof. In some embodiments, the regions between the various layers and features may comprise varying materials and/or compositions.

Figure 9A:
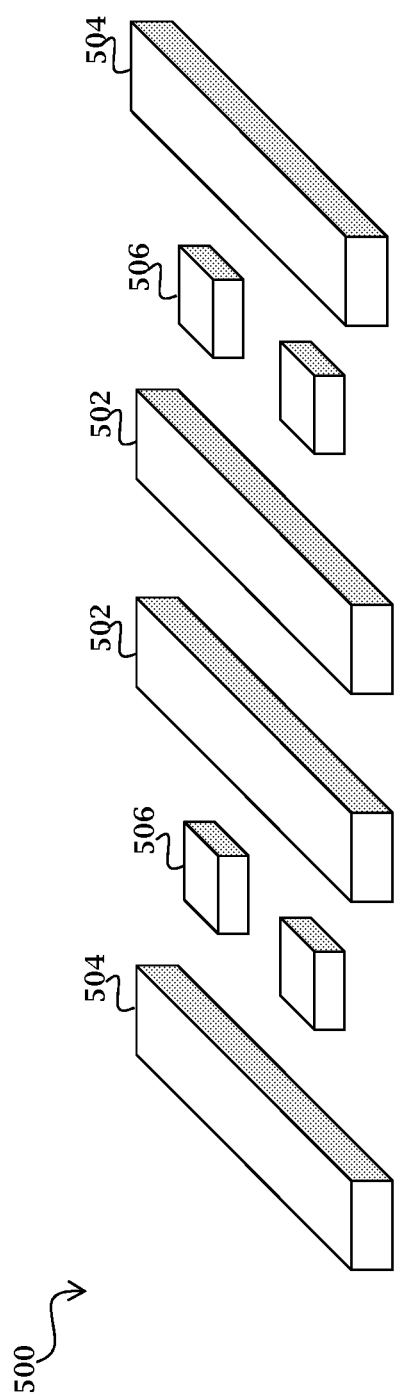
Figure 9B:
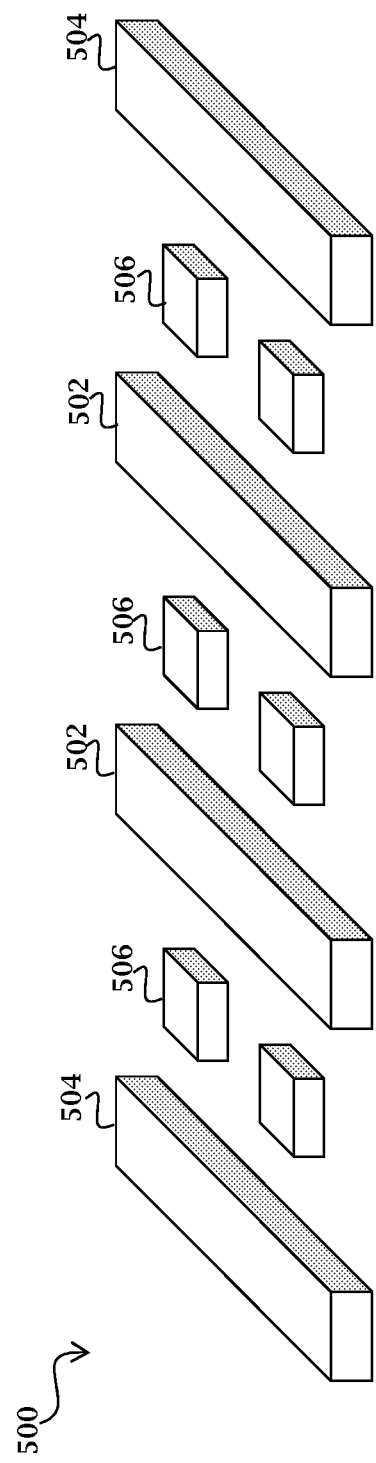
Figure 9C:
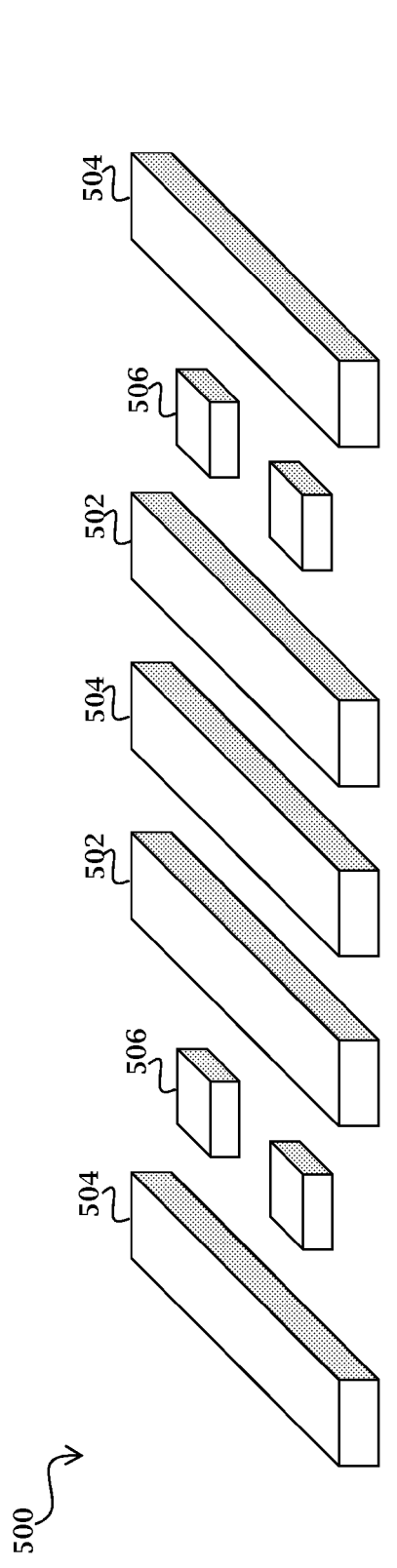
Figure 9D:
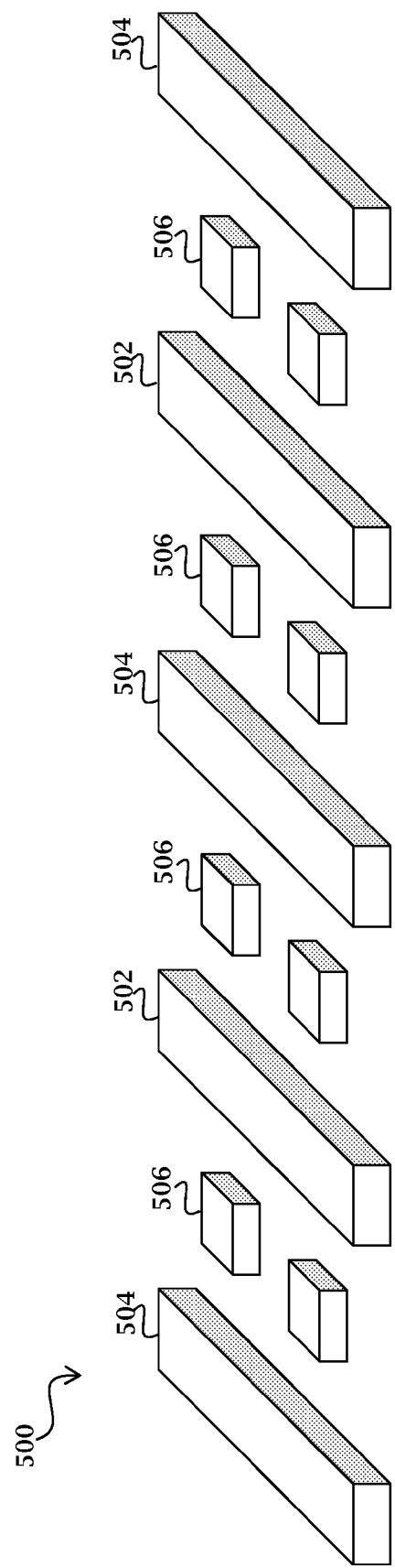

FIGS. 9A-9D show perspective views of various embodiments of a coplanar waveguide structure 500, wherein the coplanar waveguide structure 500 includes one or more signal lines, one or more ground lines, and one or more islands. The coplanar waveguide structure 500 comprises one or more signal lines 502, one or more ground lines 504, and one or more islands 506. The ground signal lines 502, ground lines 504, and islands 506 are similar to the signal lines, ground lines, and islands previously described with respect to the various embodiments above. In FIGS. 9A-9D, the signal lines 502 and ground lines 504 do not include a periodic structure, illustrating that introducing the islands 506 alone into the coplanar waveguide structure 500 increases the permittivity epsilon and results in an adjustable wavelength. The islands 506 may be disposed at periodic intervals. Referring to FIG. 9A, signal lines 502 are disposed between ground lines 504, and one or more islands 506 are disposed between each of the signal lines 502 and each of the ground lines 504. FIG. 9B is similar to FIG. 9A and additionally includes one or more islands 506 disposed between the signal lines 502. FIG. 9C is similar to FIG. 9A and additionally includes one or more ground lines 504 disposed between the signal lines 502. FIG. 9D is similar to FIG. 9A and includes one or more islands 506 disposed on either side of each signal line 502 and each ground line 504. It is understood that the coplanar waveguide structure 500 is not limited by FIGS. 9A-9D and may comprise any combination and configuration of signal lines 502, ground lines 504, and islands 506.

Figure 10C:
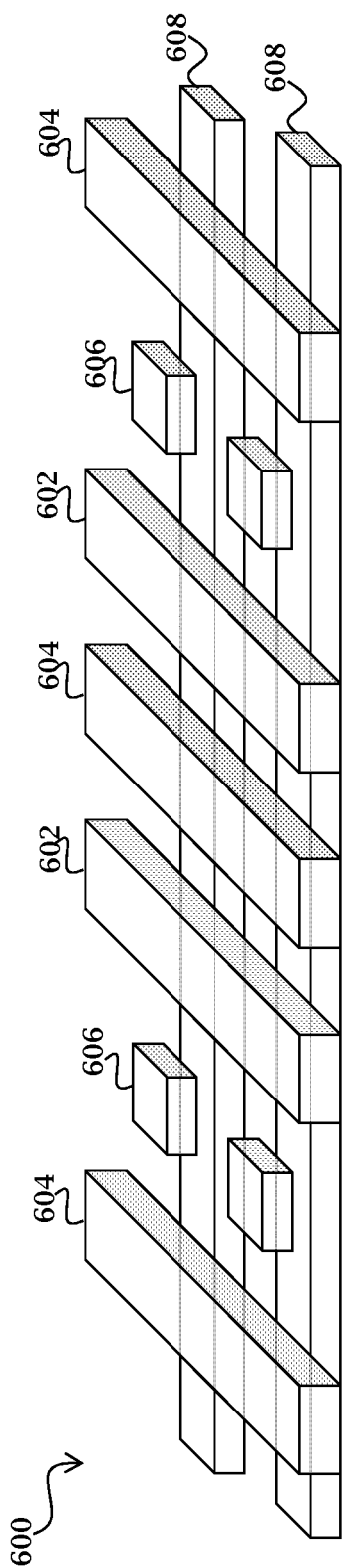
Figure 10D:
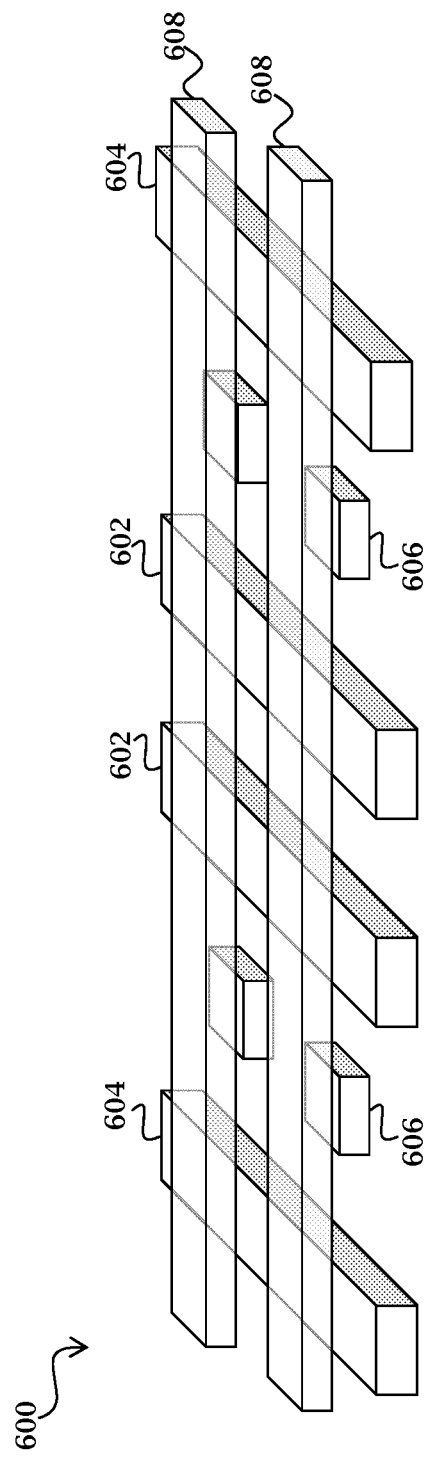

FIGS. 10A-10F show perspective views of various embodiments of a coplanar waveguide structure 600, wherein the coplanar waveguide structure 600 includes one or more floating strips above and/or beneath the signal lines/ground lines and the islands. Combining the one or more floating strips with the one or more signal lines, even absent having periodic structures, and the islands increases the permittivity epsilon and results in an adjustable wavelength. The coplanar waveguide structure 600 includes a first layer comprising one or more signal lines 602, one or more ground lines 604, and one or more islands 606 and a second layer comprising one or more floating strips 608. The signal lines 602, ground lines 604, islands 606, and floating strips 608 are similar to the signal lines, ground lines, islands, and floating strips previously described with respect to the various embodiments above. Particularly, the islands 606 and floating strips 608 may be at periodic intervals along the length of the coplanar waveguide 600, and the period of the floating strips 608 may be the same as or different than the period of the islands 606. The first layer is separated from the second layer by a dielectric layer. The second layer comprising the one or more floating strips 608 may be located below the first layer comprising the signal lines 602/ground lines 604/islands 606 as illustrated in FIGS. 10A, 10B, 10C or above the first layer comprising the signal lines 602/ground lines 604/islands 606 as illustrated in FIGS. 10D, 10E, 10F. In some embodiments, a coplanar waveguide structure may include two second layers comprising one or more floating strips, one floating strip located above the first layer and the other floating strip located below the first layer. In some embodiments, the coplanar waveguide structure may include multiple second layers comprising one or more floating strips above and/or below the first layer.

In some embodiments, as further detailed below, a reduced wavelength characteristic is achieved in transmission lines by adding periodical shielding structures (e.g., metal strip shields) in the coplanar waveguide structures. The periodical shielding structures may result in decelerating the propagation speed. Such decelerated propagation speed in a guided medium is called a slow-wave. Increasing the slow wave feature and reducing the electric filed coupled to a substrate of a device may also be achieved. Accordingly, the below embodiments, comprising coplanar waveguide structures combined with a variety of different shielding structures may be referred to as slow-wave coplanar waveguide (CPW) transmission lines. The slow-wave CPW transmission lines may increase the relative permittivity and simultaneously reduce attenuation loss.

Further, in some embodiments, the ground signals may be eventually replaced with floating shielding structures, such as those described below, particularly in high frequency devices. An AC source causes the polarity of the ground potential to alternate between positive and negative over the complete RF cycle, resulting in energy being coupled to a conductive substrate. Since shielding structures in the present embodiments may be adequate conductors, and may also be isolated, there is no net charge on the shielding structures. Thus, no electromagnetic flux exists below the shielding structures, and the shielding structures are immune to both positive and negative potential swings, which allows energy coupled to a substrate to be minimized. Consequently, the shielding structures may essentially replace a ground connection in some embodiments.

Figure 11:
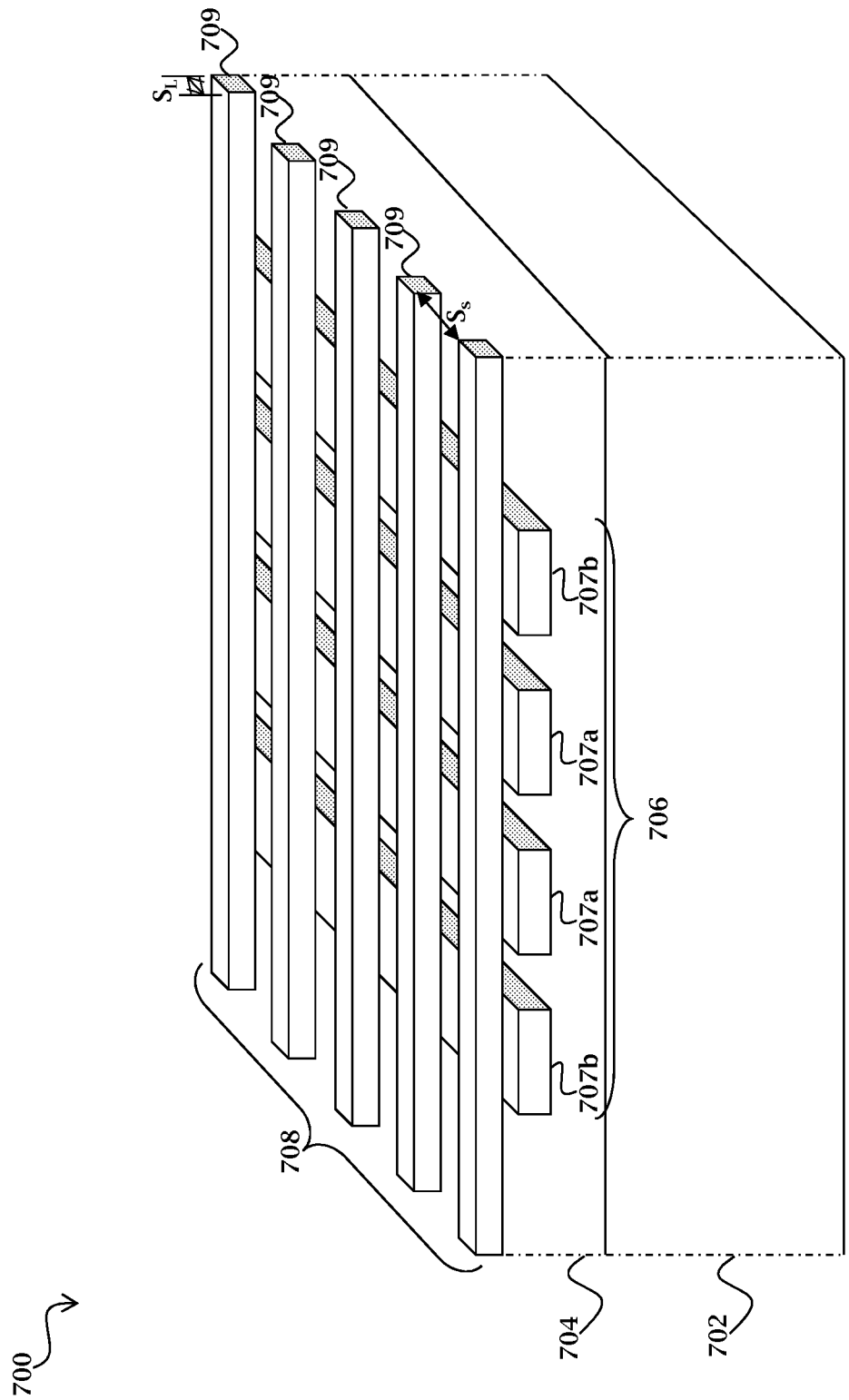
FIGS. 11-24 illustrate perspective views of a device including a coplanar waveguide structure according to various embodiments.

Referring to FIG. 11, a transverse cross-sectional view of a device 700 including a lower substrate 702, an upper substrate 704, a coplanar waveguide structure 706 including one or more conductor lines 707a, 707b, and a shielding structure 708 including one or more slot-type floating strips 709 is provided.

The lower substrate 702 may comprise any suitable material and any suitable thickness. In the present embodiment, the lower substrate 702 comprises a semiconductor substrate, such as a silicon substrate. The lower substrate 702 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the substrate may be a semiconductor on insulator (SOI) or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure. In some embodiments, the lower substrate 702 may comprise glass.

The lower substrate 702 may further include multiple layers comprising the same or varying materials. The lower substrate 702 may include various doping configurations depending on design requirements as known in the art (e.g., p-type substrate regions or n-type substrate regions). In some embodiments, the lower substrate 702 may include doped regions. It is understood that the lower substrate 702 may comprise partially or fully fabricated devices, structures, and or features known in the art, including but not limited to gate structures, source/drain regions, lightly doped regions, shallow trench isolations, transistors, diodes, vias, trenches, various contacts/vias and multilayer interconnect features (e.g., metal layers and interlayer dielectrics), other features, and/or combinations thereof.

The upper substrate 704 is formed over the lower substrate 702. The upper substrate 704 may comprise any suitable material and any suitable thickness. In the present embodiment, the upper substrate 104 comprises a dielectric material, such as tetraethyl orthosilicate (TEOS) oxide, silicon oxide, silicon nitride, silicon oxynitride, hafnium oxide, zirconium oxide, titanium oxide, aluminum oxide, hafnium dioxide-alumina ($HfO_2$—$Al_2O_3$) alloy, phosphosilicate glass (PSG), borophosphosilicate glass (BPSG), other suitable dielectric materials, and/or combinations thereof In some embodiments, the upper substrate 104 may comprise a high-k dielectric material, which may include metal oxides, metal nitrides, metal silicates, transition metal-oxides, transition metal-nitrides, transition metal-silicates, oxynitrides of metals, metal aluminates, zirconium silicate, zirconium aluminate, $HfO_2$, HfSiO, HfSiON, HfTaO, HfTaTiO, HfTiO, HfZrO, HfAlON, other suitable high-k dielectric materials, and/or combinations thereof. In some embodiments, the upper substrate may comprise a low-k dielectric material, such as fluorinated silica glass (FSG), carbon doped silicon oxide, BLACK DIAMOND® (Applied Materials of Santa Clara, California) including comparable low-k dielectric material, xerogel, aerogel, amorphous fluorinated carbon, PARYLENE including comparable low-k coating material, BCB (bis-benzocyclobutenes), SILK™ (Dow Chemical, Midland, Michigan) including comparable low-k polymer material, polyimide, other proper porous polymeric materials, and/or combinations thereof. It is understood that the upper substrate 704 may include a multilayer structure, wherein each layer comprises the same or varying materials, such as varying dielectric and metal materials. It is further understood that additional layers may be formed overlying and/or underlying the upper substrate 704.

The coplanar waveguide structure 706 and the shielding structure 708 may be formed above, below, and/or within upper substrate 704. The coplanar waveguide structure 706 comprises the one or more conductor lines 707a, 707b. The one or more conductor lines 707a, 707b are similar to the conductor lines, signal lines, and ground lines described herein. For example, the one or more conductor lines 707a comprise signal lines and the one or more conductor lines 707b comprise ground lines. Similar to the signal lines/ground lines described above, in some embodiments, at least one of the one or more conductor lines 707a and/or ground lines 707b may include a periodic structure (not specifically shown in FIG. 11). Further, the signal lines 707a/ground lines 707b may comprise any suitable material and any suitable thickness. For example, the signal lines 707a/ground lines 707b may comprise a metal, such as aluminum, copper, tungsten, titanium, tantulum, titanium nitride, tantalum nitride, nickel silicide, cobalt silicide, silver, TaC, TaSiN, TaCN, TiAl, TiAlN, metal alloys, other suitable materials, and/or combinations thereof. In some embodiments, the signal lines 707a/ground lines 707b may comprise the same material or varying materials. Regions between the one or more conductor lines 707a, 707b may be portions of the upper substrate 704, insulating regions, low-k dielectric regions, high-k dielectric regions, other suitable dielectric regions, other suitable regions, and/or combinations thereof.

In the present embodiment, the shielding structure 708 including the one or more slot-type floating strips 709 is formed above the coplanar waveguide structure 706. In some embodiments, a shielding structure may include one or more slot-type floating strips formed below the coplanar waveguide structure. The slot-type floating strips 709 may extend transversely to the coplanar waveguide structure 706 and may further extend across substantially the entire width of the coplanar waveguide structure 706 or alternatively slot-type floating strips may extend a portion of the width of a coplanar waveguide structure. The slot-type floating strips 709 are similar to the floating strips described above, comprising a strip length $S_L$, which may be any suitable length. The slot-type floating strips are spaced apart at any suitable distance $S_S$. In some embodiments, each of the slot-type floating strips may be spaced apart equal distances and/or varying distances. The slot-type floating strips 709 may be at periodic intervals along the length of the coplanar waveguide structure 706. If at such periodic intervals, the slot-type floating strips 709 may disposed at any suitable period. The slot-type floating strips 709 comprise any suitable material. For example, the slot-type floating strips 709 may comprise a conductive material, such as aluminum, copper, tungsten, titanium, tantulum, titanium nitride, tantalum nitride, nickel silicide, cobalt silicide, silver, TaC, TaSiN, TaCN, TiAl, TiAlN, metal alloys, other suitable materials, and/or combinations thereof. In some embodiments, each of the one or more slot-type floating strips 709 may comprise the same material or varying materials. Further, the one or more slot-type floating strips 709 may be electrically intercoupled and/or electrically isolated from one another; electrically coupled to one or more of the conductor lines 707a, 707b, and/or a reference voltage or signal; completely electrically isolated; and/or combinations thereof. Where one or more slot-type floating strips 709 are electrically coupled, the electrical coupling may be through an interconnect or via. Regions between the slot-type floating strips 709 and regions between the coplanar waveguide structure 706 and the shielding structure 708 may be portions of the upper substrate 704, insulating regions, low-k dielectric regions, high-k dielectric regions, other suitable dielectric regions, other suitable regions, and/or combinations thereof.

Figure 12:
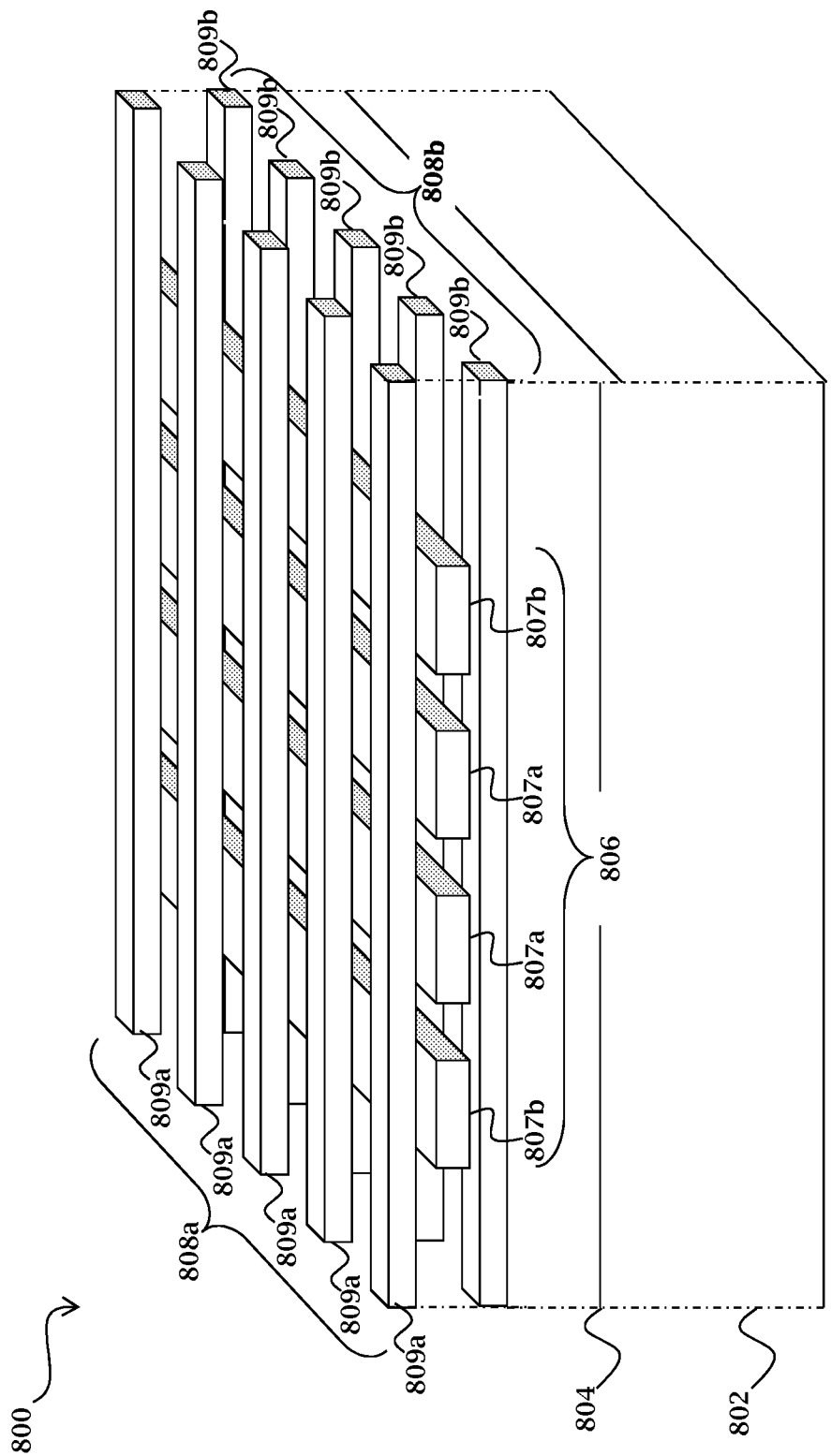

Referring to FIG. 12, a transverse cross-sectional view of a device 800 including a lower substrate 802, an upper substrate 804, a coplanar waveguide structure 806 including one or more conductor lines 807a, 807b, and a shielding structure including a first portion 808a and a second portion 808b (collectively referred to as a shielding structure 808), the first and second portions 808a, 808b comprising one or more slot-type floating strips 809a, 809b, is provided. The lower substrate 802, upper substrate 804, coplanar waveguide structure 806 including one or more conductor lines 807a, 807b are similar to the lower substrate, upper substrate, and coplanar waveguide structure including one or more conductor lines described above with reference to FIG. 11. However, in the present embodiment, the shielding structure 808 includes the first portion 808a comprising one or more slot-type floating strips 809a formed above the coplanar waveguide structure 806 and the second portion 808b comprising one or more slot-type floating strips 809b formed above the coplanar waveguide structure 806. The slot-type floating strips 809a, 809b are similar to the slot-type floating strips 709 described in FIG. 11. The slot-type floating strips 809a, 809b extend transversely to the coplanar waveguide structure 806 and may further extend across substantially the entire width of the coplanar waveguide structure 806; or alternatively slot-type floating strips may extend a portion of the width of a coplanar waveguide structure. The slot-type floating strips 809a, 809b are spaced apart at any suitable distance. In some embodiments, each of the slot-type floating strips may be spaced apart equal distances and/or varying distances. The slot-type floating strips 809a, 809b may be at periodic intervals along the length of the coplanar waveguide structure 806. If at such periodic intervals, the slot-type floating strips 809a, 809b may disposed at any suitable period. It is understood that the first portion 808a comprising one or more slot-type floating strips 809a and the second portion 808b comprising one or more slot-type floating strips 809b may be the same or different in form, substance, and/or dimension. For example, the first portion 808a may include the slot-type floating strips 809a comprising a first material and/or placed at a first periodical interval; and the second portion 808b may include the slot-type floating strips 809b comprising a second material and/or placed at a second periodical interval.

Figure 13:
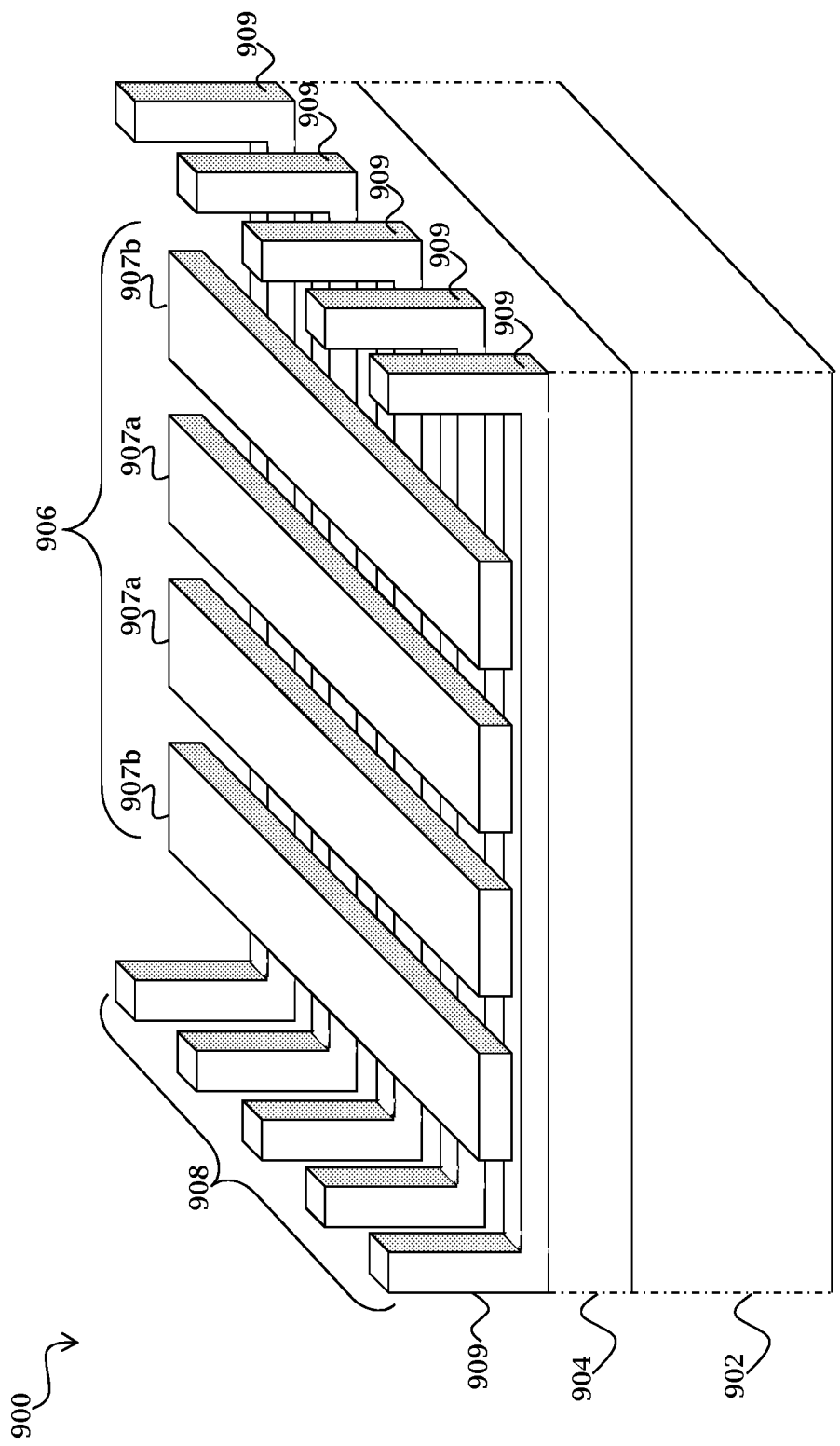
Figure 14:
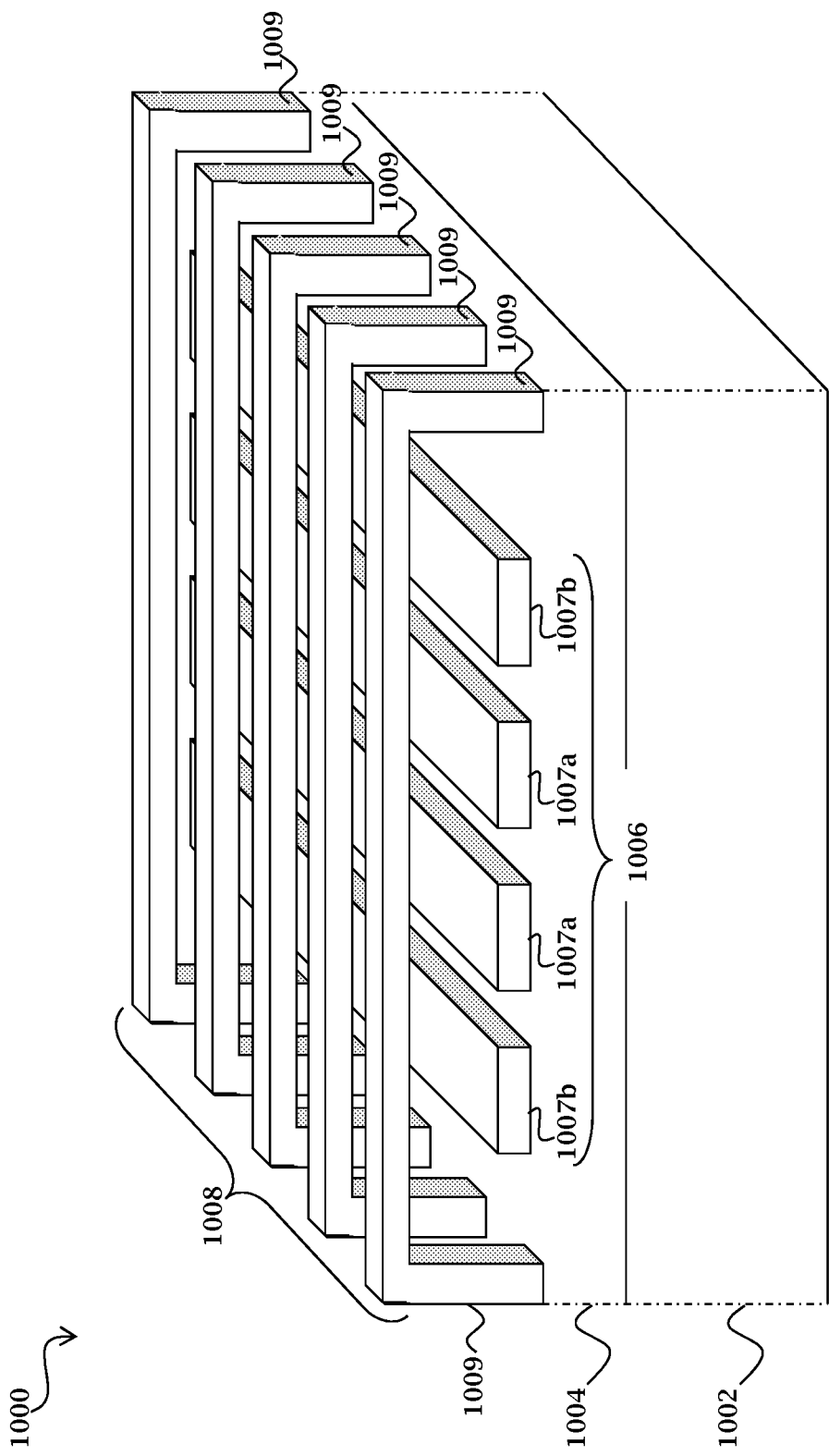

FIGS. 13 and 14 provide transverse cross-sectional views of devices 900 and 1000 respectively comprising shielding structures including one or more slot-type floating strips having extensions. In FIG. 13, the device 900 comprises a lower substrate 902, an upper substrate 904, a coplanar waveguide structure 906 including one or more conductor lines 907a, 907b, and a shielding structure 908 including one or more slot-type floating strips 909 having one or more extensions. In FIG. 14, the device 1000 comprises a lower substrate 1002, an upper substrate 1004, a coplanar waveguide structure 1006 including one or more conductor lines 1007a, 1007b, and a shielding structure 1008 including one or more slot-type floating strips 1009 having one or more extensions. The lower substrates 902, 1002; upper substrates 904, 1004; and coplanar waveguide structures 906, 1006 including one or more conductor lines 907a, 907b, 1007a, 1007b are respectively similar to the lower substrates, upper substrates, and coplanar waveguide structures including one or more conductor lines described above.

The shielding structures 908, 1008 including one or more slot-type floating strips 909, 1009 are also similar to the shielding structures described above, except the shielding structures 908, 1008 include one or more slot-type floating strips 909, 1009 having extensions. It is understood that the extensions may be an integral part of slot-type floating strips or in some embodiments, the extensions may be separate features of a shielding structures, coupled (and/or connected) to slot-type floating strips. Referring to FIG. 13, the shielding structure 909 is formed below the coplanar waveguide structure 906, and the slot-type floating strips 909 also include a portion that extends from below the coplanar waveguide structure 906 to above (or even with) the coplanar waveguide structure 906 (i.e., extends upwardly away from the lower substrate 902 and upper substrate 904). Referring to FIG. 14, the shielding structure 1008 is formed above the coplanar waveguide structure 1006, and the slot-type floating strips 1009 include a portion that extends from above the coplanar waveguide structure 1006 to below (or even with) the coplanar waveguide structure 1006 (i.e., extends downwardly toward the lower substrate 1002 and upper substrate 1004). The portions of the slot-type floating strips 909, 1009 may extend partially or entirely along the height of the coplanar waveguide structures 906, 1006. In the present embodiments, the portion of the slot-type floating strips 909, 1009 that extends vertically forms a rectangular-shaped extension. It is contemplated that slot-type floating strips may include other shaped extensions, such as circular-shaped, elliptical-shaped, triangular-shaped, other suitable shapes, and/or combinations thereof.

Figure 15:
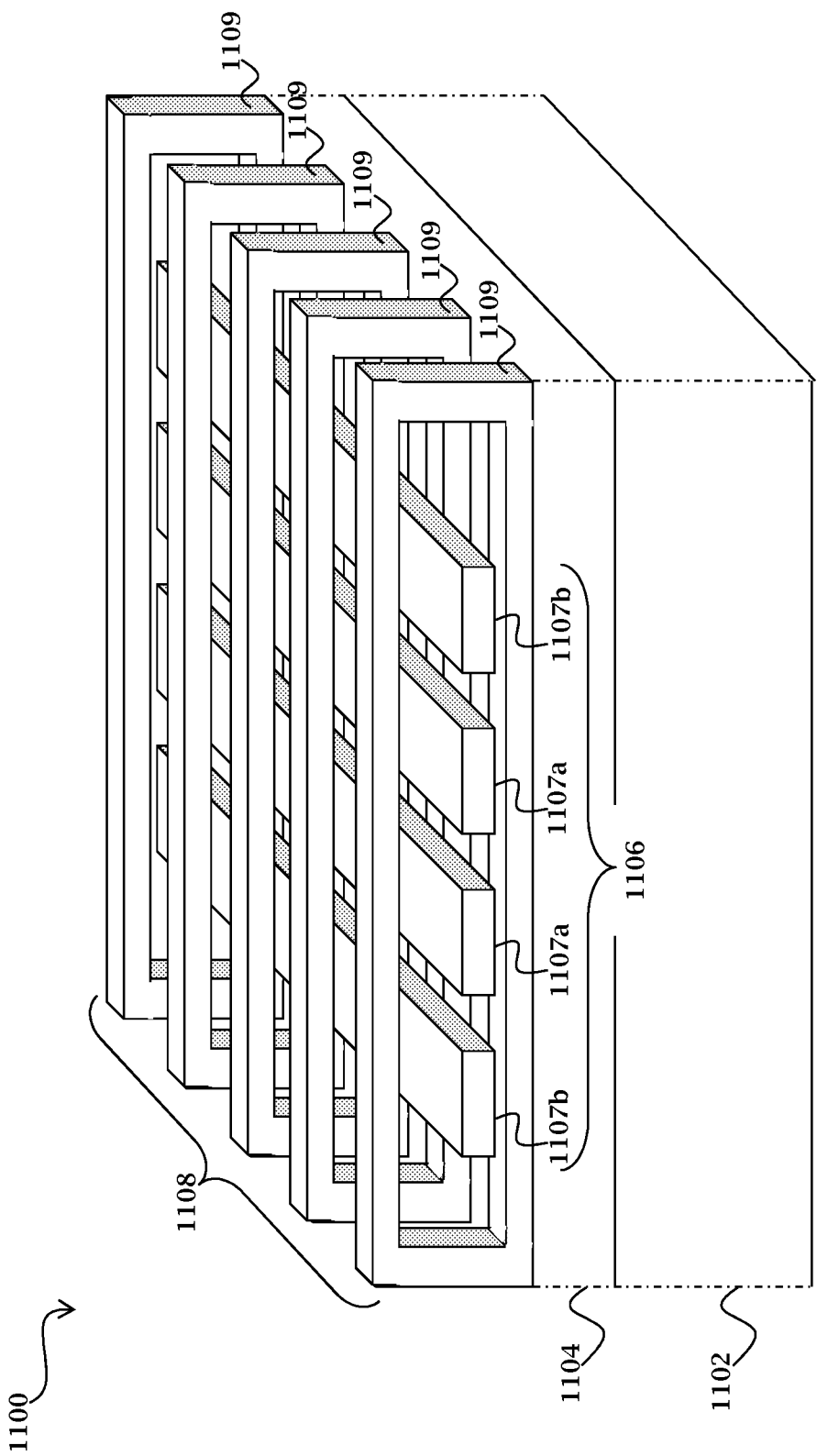

FIG. 15 provides a transverse cross-sectional view of device 1100 comprising a lower substrate 1102, an upper substrate 1104, a coplanar waveguide structure 1106 including one or more conductor lines 1107a, 1107b, and a shielding structure 1108 including one or more slot-type floating shields 1109. The lower substrate 1102, upper substrate 1104, and coplanar waveguide structure 1106 including one or more conductor lines 1107a, 1107b are similar to the lower substrates, upper substrates, and coplanar waveguide structures including one or more conductor lines described above. In the present embodiment, the slot-type floating shields 1109 are rectangular-shaped, surrounding the coplanar waveguide structure 1106. It is understood that slot-type floating shields may comprise any suitable shape, for example, surrounding the coplanar waveguide with circular-shaped slot-type floating shields. The slot-type floating shields 1109 may be spaced at periodic intervals at any suitable period along the length of the coplanar waveguide structure 1106. Additionally, the slot-type floating shields 1109 may be similar in various respects to the slot-type floating strips and slot-type floating strips having extension described above. Further, the one or more slot-type floating shields 1109 may be electrically intercoupled and/or electrically isolated from one another; electrically coupled to one or more of the conductor lines 1107a, 1107b, and/or a reference voltage or signal; completely electrically isolated; and/or combinations thereof. Where one or more slot-type floating shields 1109 are electrically coupled, the electrical coupling may be through an interconnect or via.

Figure 16:
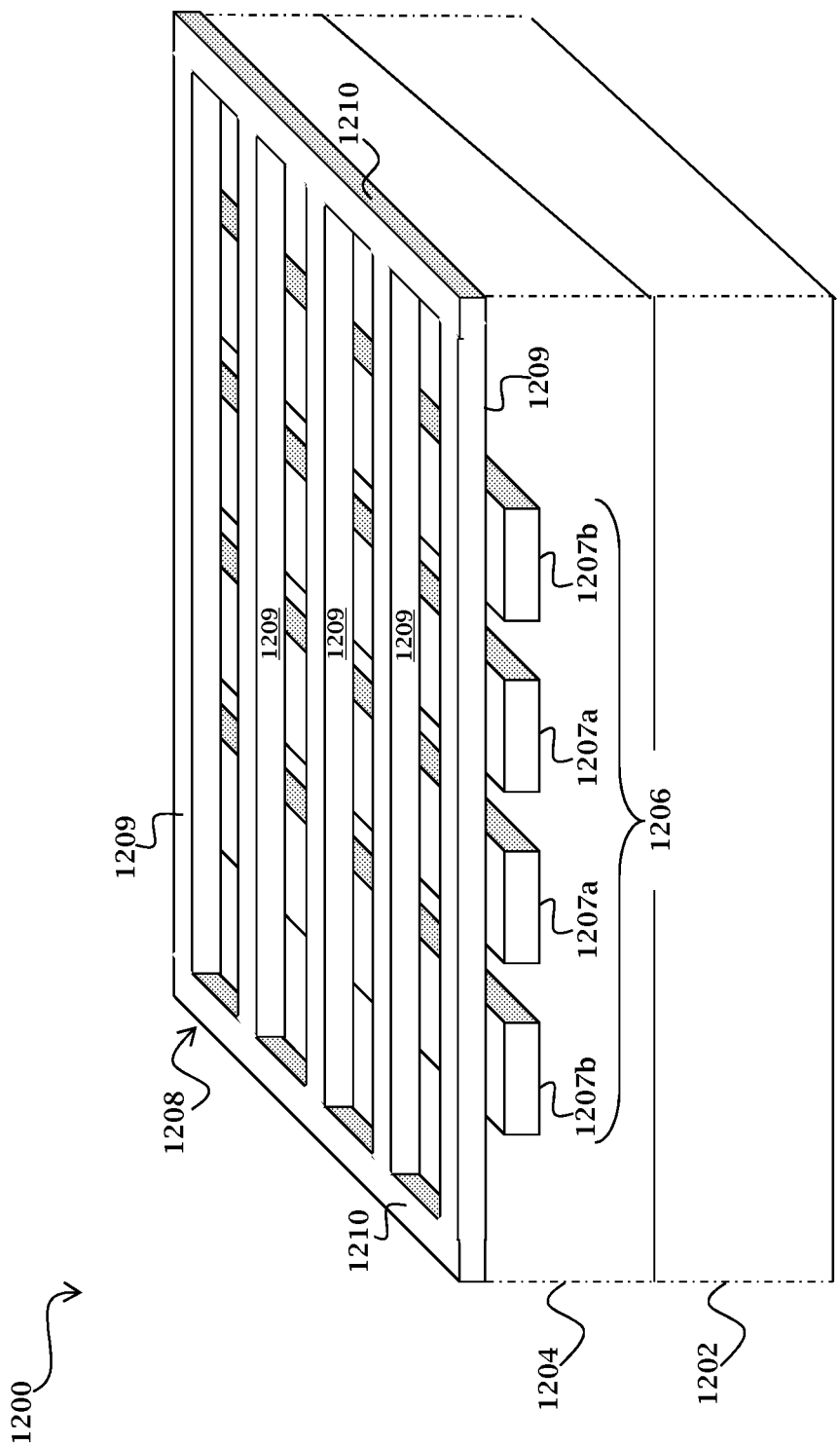
Figure 17:
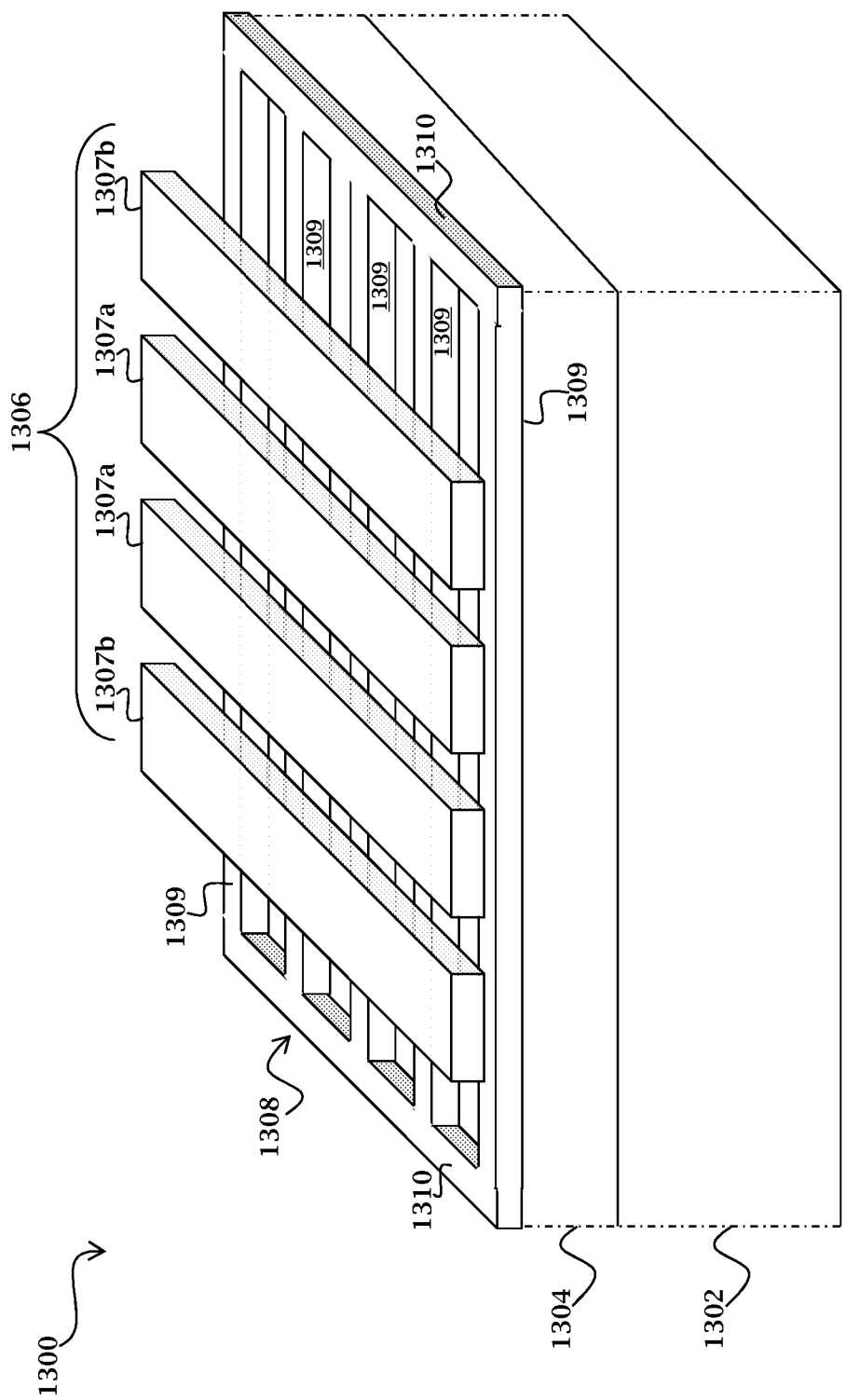
Figure 18:
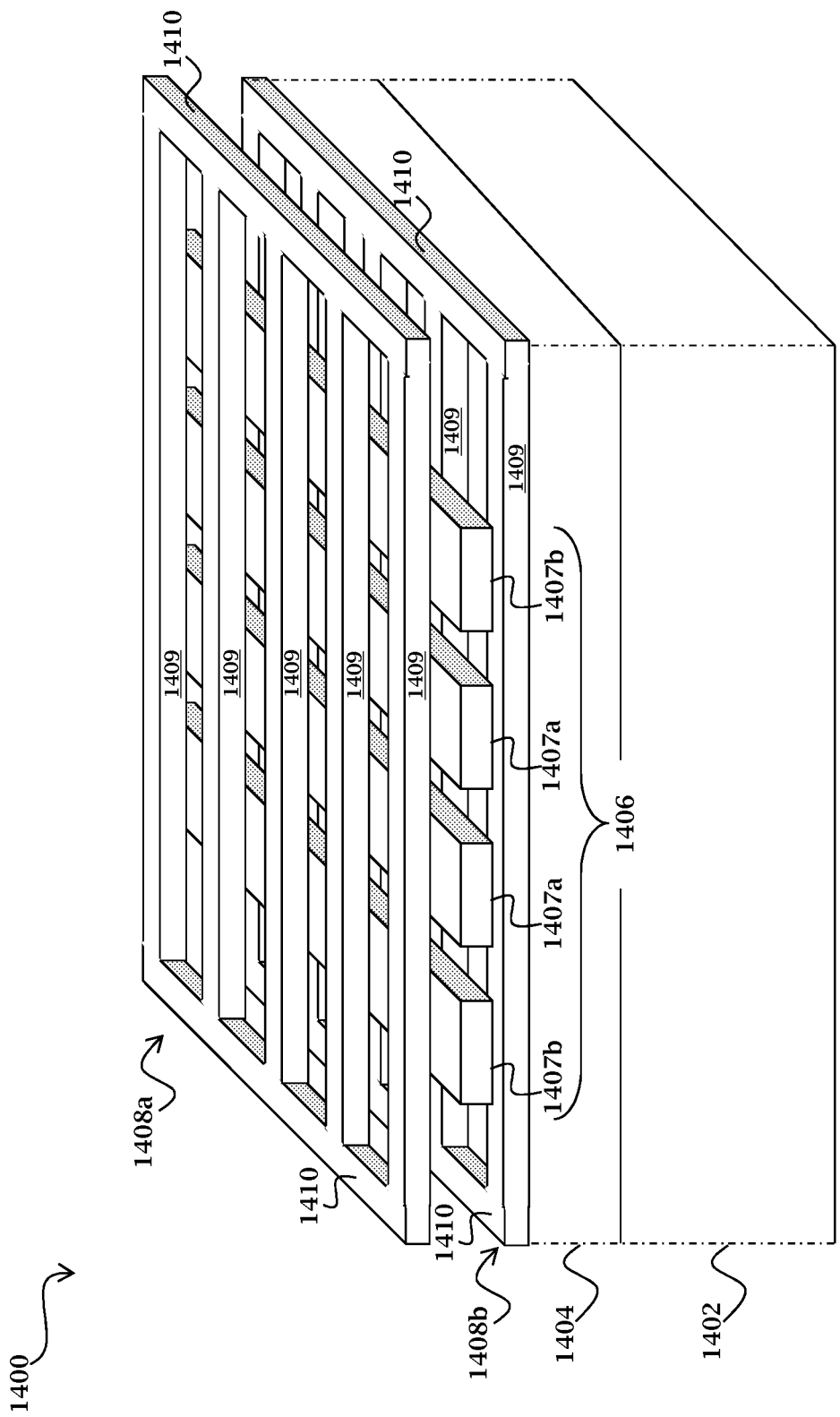

FIGS. 16, 17, and 18 provide transverse cross-sectional views of devices 1200, 1300, and 1400 respectively comprising shielding structures according to various embodiments. In FIG. 16, the device 1200 comprises a lower substrate 1202, an upper substrate 1204, a coplanar waveguide structure 1206 including one or more conductor lines 1207a, 1207b, and a shielding structure 1208 including one or more slot-type floating strips 1209 and one or more slot-type grounded strips 1210. In FIG. 17, the device 1300 comprises a lower substrate 1302, an upper substrate 1304, a coplanar waveguide structure 1306 including one or more conductor lines 1307a, 1307b, and a shielding structure 1308 including one or more slot-type floating strips 1309 and one or more slot-type grounded strips 1310. In FIG. 18, the device 1400 comprises a lower substrate 1402, an upper substrate 1404, a coplanar waveguide structure 1406 including one or more conductor lines 1407a, 1407b, and a shielding structure comprising a first portion 1408a and a second portion 1408b (collectively referred to as shielding structure 1408), wherein the first and second portions 1408a, 1408b include one or more slot-type floating strips 1409 and one or more slot-type grounded strips 1410. The lower substrates 1202, 1302, 1402; upper substrates 1204, 1304, 1404; and coplanar waveguide structures 1206, 1306, 1406 including one or more conductor lines 1207a, 1207b, 1307a, 1307b, 1407a, 1407b are respectively similar to the lower substrates, upper substrates, and coplanar waveguide structures including one or more conductor lines described above.

The shielding structures 1208, 1308, 1408 are respectively similar to the shielding structures described above, particularly, the slot-type floating strips 1209, 1309, 1409 are respectively similar to the slot-type floating strips described above. However, in the present embodiments, the shielding structures 1208, 1308, 1408 respectively include one or more slot-type grounded strips 1210, 1310, 1410 coupled to (and/or connected to) the slot-type floating strips 1209, 1309, 1409. For example, referring to FIG. 16, the shielding structure 1209 is formed above the coplanar waveguide structure 1206, and the slot-type floating strips 1209 are coupled to one or more slot-type grounded strips 1210. Referring to FIG. 17, the shielding structure 1308 is formed below the coplanar waveguide structure 1306, and the slot-type floating strips 1309 are coupled to one or more slot-type grounded strips 1310. Referring to FIG. 18, the shielding structure 1408 comprises a first portion 1408a formed above the coplanar waveguide structure 1406 and a second portion 1408b formed below the coplanar waveguide structure 1406, and the slot-type floating strips 1409 are coupled to one or more slot-type grounded strips 1410.

The one or more slot-type grounded strips 1210, 1310, 1410 may extend partially or entirely along the length of the coplanar waveguide structures 1206, 1306, 1406. The slot-type grounded strips 1210, 1310, 1410 are substantially uniform in length, height, and width, and further lie substantially parallel with respect to one another. It is understood that, in alternate embodiments, slot-type grounded strips may comprise varying lengths, heights, and/or widths. In the present embodiments, the shielding structures comprise two substantially identical parallel slot-type grounded strips 1210, 1310, 1410 coupled to the slot-type floating strips 1209. The slot-type grounded strips 1210, 1310, 1410 may be similar to the slot-type floating strips described above; for example, the slot-type grounded strips 1210, 1310, 1410 comprise any suitable material, for example, a conductive material, such as aluminum, copper, tungsten, titanium, tantalum, titanium nitride, tantalum nitride, nickel silicide, cobalt silicide, silver, TaC, TaSiN, TaCN, TiAl, TiAlN, metal alloys, other suitable materials, and/or combinations thereof. In some embodiments, each of the one or more slot-type grounded strips 1210, 1310, 1410 may comprise the same material or varying materials. Regions between the slot-type grounded strips 1210, 1310, 1410 and/or the slot-type floating strips 1208, 1308, 1408 and regions between the coplanar waveguide structures 1206, 1306, 1406 and the shielding structures 1208, 1308, 1408 may be portions of the upper substrates 1204, 1304, 1404, insulating regions, low-k dielectric regions, high-k dielectric regions, other suitable dielectric regions, other suitable regions, and/or combinations thereof.

The slot-type grounded strips 1210, 1310, 1410 are at any suitable position. Adjusting the position of the slot-type grounded strips 1210, 1310, 1410 allows the characteristic impedance of the devices 1200, 1300, 1400 to be varied and tuned as desired. Where high performance requirements are desired, such as in high quality stub inductors, impedance matching networks of a quarter-wavelength-long transmission line, resonators, oscillators, signal splitters, combiners, amplifiers, and filters, the tunable characteristic impedance provided is highly desirable. In some embodiments, each of the slot-type grounded strips 1210, 1310, 1410 may be spaced apart equal distances and/or varying distances. In some embodiments, the slot-type grounded strips 1210, 1310, 1410 may be at periodic intervals along the width of the coplanar waveguide structures 1206, 1306, 1406 at any suitable period. Further, the one or more slot-type grounded strips 1210, 1310, 1410 may be electrically intercoupled and/or electrically isolated from one another; electrically coupled to one or more of the conductor lines 1207a, 1207b, 1307a, 1307b, 1407a, 1407b, and/or a reference voltage or signal; completely electrically isolated; and/or combinations thereof. Where one or more slot-type grounded strips 1210, 1310, 1410 are electrically coupled, the electrical coupling may be through an interconnect or via.

Figure 19:
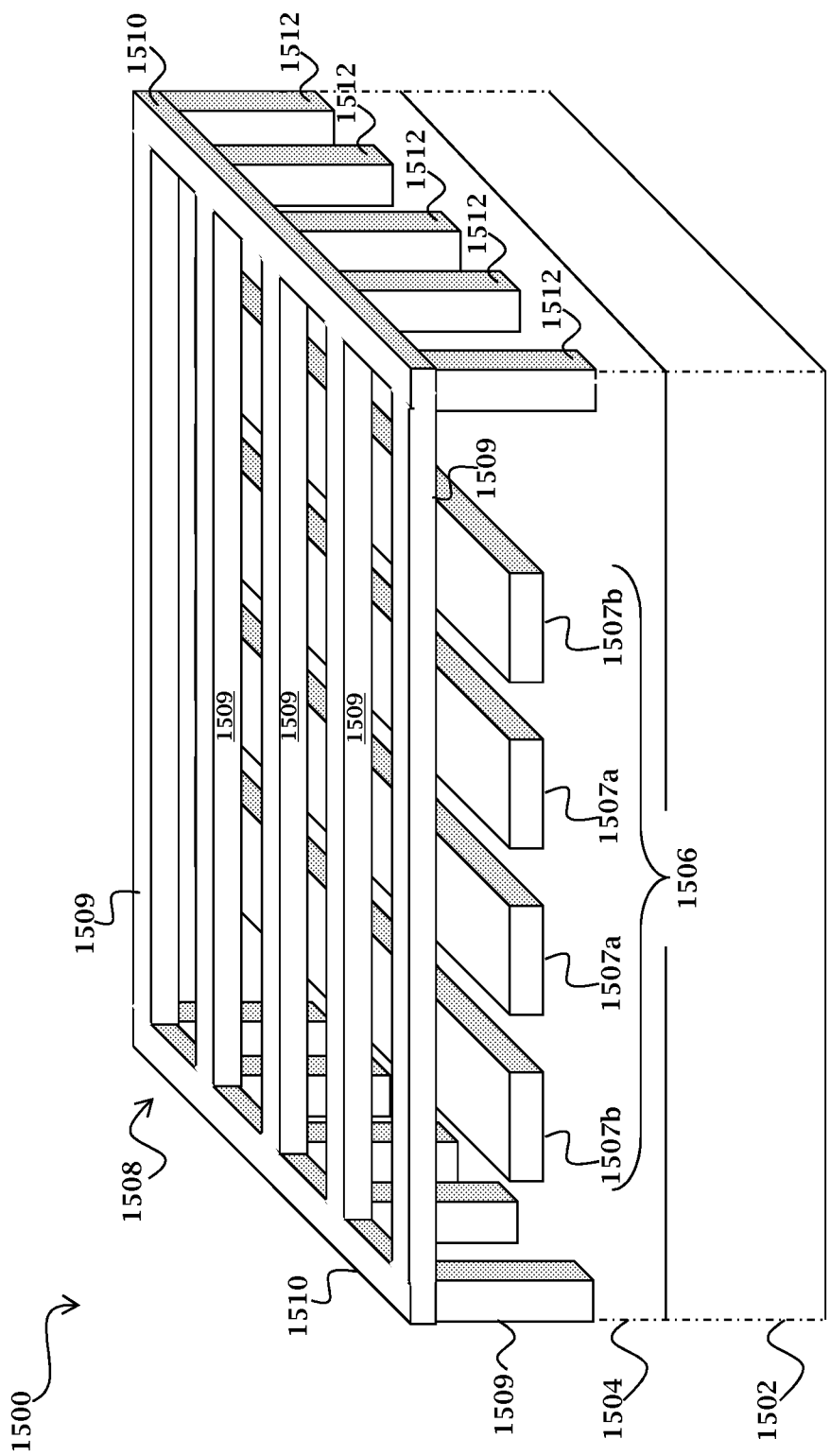
Figure 20:
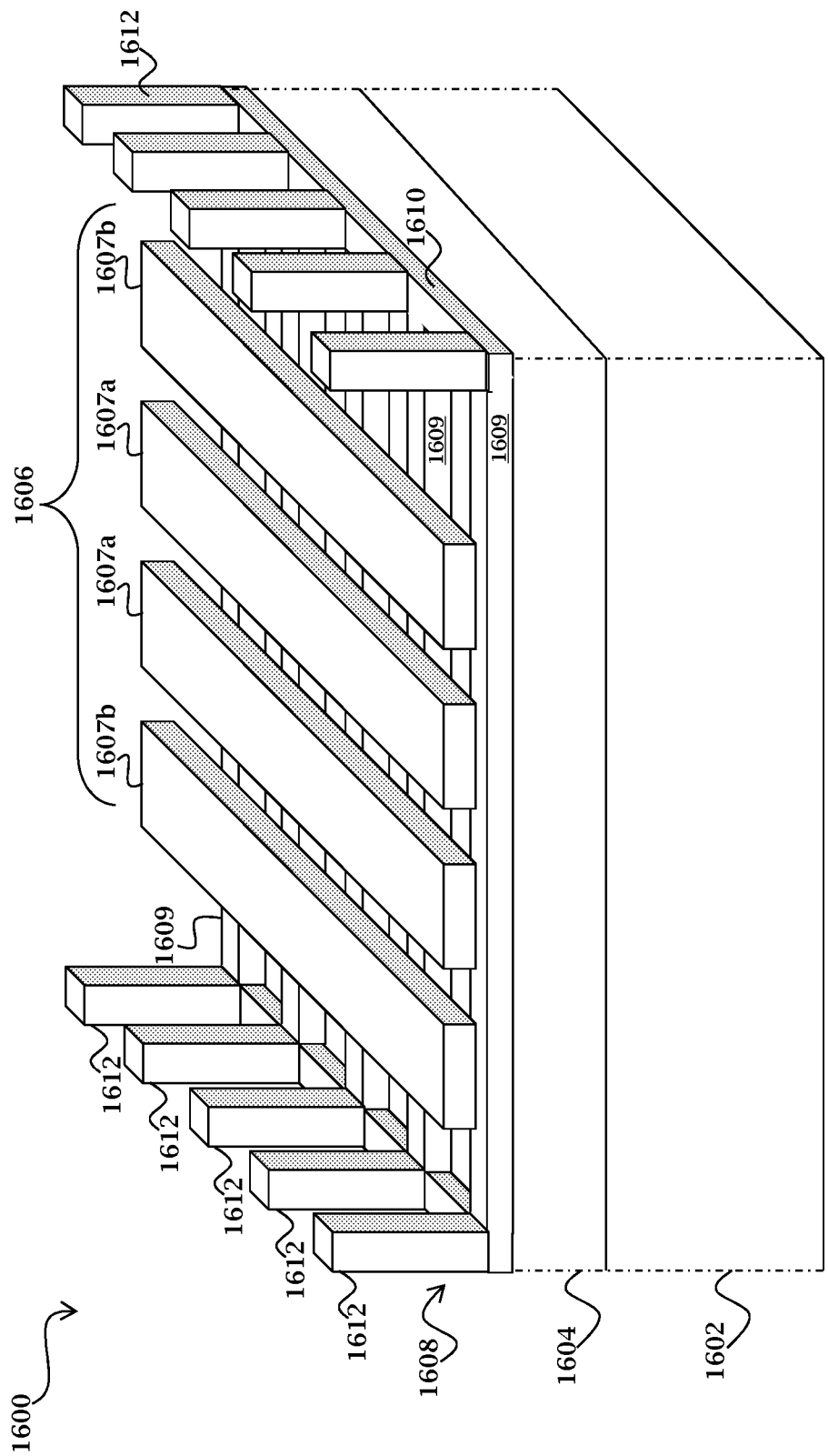
Figure 21:
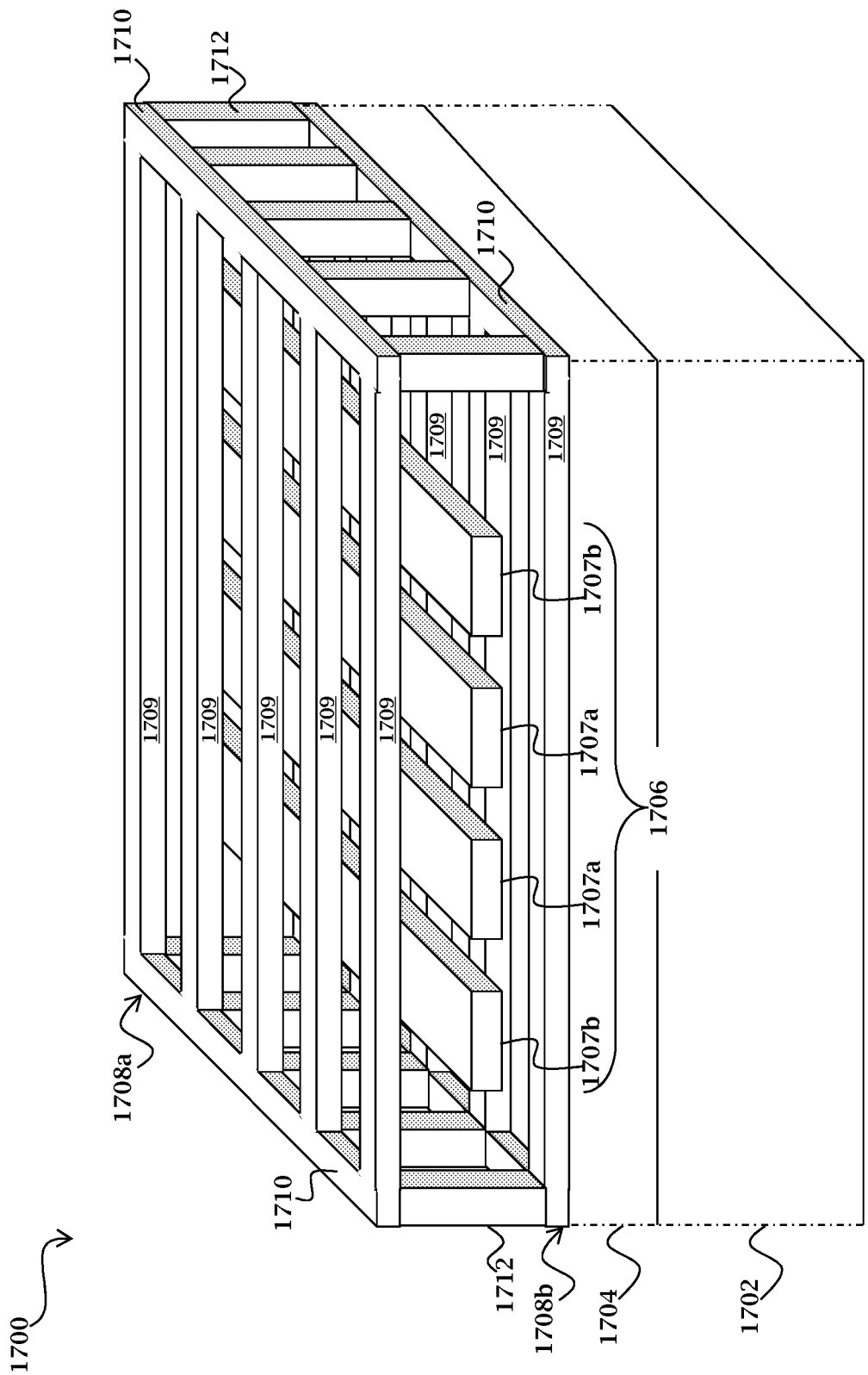

FIGS. 19, 20, and 21 provide transverse cross-sectional views of devices 1500, 1600, and 1700 respectively comprising shielding structures according to various embodiments. In FIG. 19, the device 1500 comprises a lower substrate 1502, an upper substrate 1504, a coplanar waveguide structure 1506 including one or more conductor lines 1507a, 1507b, and a shielding structure 1508 including one or more slot-type floating strips 1509, one or more slot-type grounded strips 1510, and one or more extensions 1512. In FIG. 20, the device 1600 comprises a lower substrate 1602, an upper substrate 1604, a coplanar waveguide structure 1606 including one or more conductor lines 1607a, 1607b, and a shielding structure 1608 including one or more slot-type floating strips 1609, one or more slot-type grounded strips 1610, and one or more extensions 1612. In FIG. 21, the device 1700 comprises a lower substrate 1702, an upper substrate 1704, a coplanar waveguide structure 1706 including one or more conductor lines 1707a, 1707b, a shielding structure comprising a first portion 1708a and a second portion 1708b (collectively referred to as shielding structure 1708), wherein the first and second portions 1708a, 1708b include one or more slot-type floating strips 1709, one or more slot-type grounded strips 1710, and extensions 1712. The lower substrates 1502, 1602, 1702; upper substrates 1504, 1604, 1704; and coplanar waveguide structures 1506, 1606, 1706 including one or more conductor lines 1507a, 1507b, 1607a, 1607b, 1707a, 1707b are respectively similar to the lower substrates, upper substrates, and coplanar waveguide structures including one or more conductor lines described above.

The shielding structures 1508, 1608, 1708 including the slot-type floating strips 1509, 1609, 1709 and slot-type grounding strips 1510, 1610, 1710 are also similar to the shielding structures including slot-type floating strips and/or slot-type grounding strips described above, except the shielding structures 1508, 1608, 1708 include one or more extensions 1512, 1612, 1712. For example, referring to FIG. 19, the slot-type floating strips 1509 and slot-type grounding strips 1510 of the shielding structure 1508 are formed above the coplanar waveguide structure 1506, and the extensions 1512 extend from above the coplanar waveguide structure 1506 to below (or even with) the coplanar waveguide structure 1506 (i.e., extends downwardly toward the lower substrate 1502 and upper substrate 1504). Referring to FIG. 20, the slot-type floating strips 1609 and slot-type grounding strips 1610 of the shielding structure 1608 are formed below the coplanar waveguide structure 1606, and the extensions 1612 extend from below the coplanar waveguide structure 1606 to above (or even with) the coplanar waveguide structure 1606 (i.e., extends upwardly away from the lower substrate 1602 and upper substrate 1604). Referring to FIG. 21, the slot-type floating strips 1709 and slot-type grounding strips 1710 of the shielding structure 1708 are formed above and below the coplanar waveguide structure 1706, and the extensions 1712 extend from the slot-type floating/grounding strips 1709/1710 above the coplanar waveguide structure 1706 to below the slot-type floating/grounding strips 1709/1710 below the coplanar waveguide structure 1706. The extensions 1512, 1612, 1712 may be coupled to (and/or connected with) the slot-type floating strips 1509, 1609, 1709 and/or slot-type grounding strips 1510, 1610, 1710. The extensions 1512, 1612, 1712 may extend partially or entirely along the height of the coplanar waveguide structures 1506, 1606, 1706 and/or partially or entirely between the slot-type floating/grounding strips 1709/1710 above the coplanar waveguide structure 1706 and the slot-type floating/grounding strips 1709/1710 below the coplanar waveguide structure 1706. In the present embodiments, the extensions 1512, 1612, 1712 are rectangular-shaped. It is contemplated that extensions from slot-type floating/grounding strips may include other shaped extensions, such as circular-shaped, elliptical-shaped, triangular-shaped, other suitable shapes, and/or combinations thereof. Further, similarly to the devices described above, the slot-type floating strips 1509, 1609, 1709 are oriented transversely to the coplanar waveguide structures 1506, 1606, 1706. It is understood that slot-type floating strips may be oriented differently in other embodiments.

Figure 22:
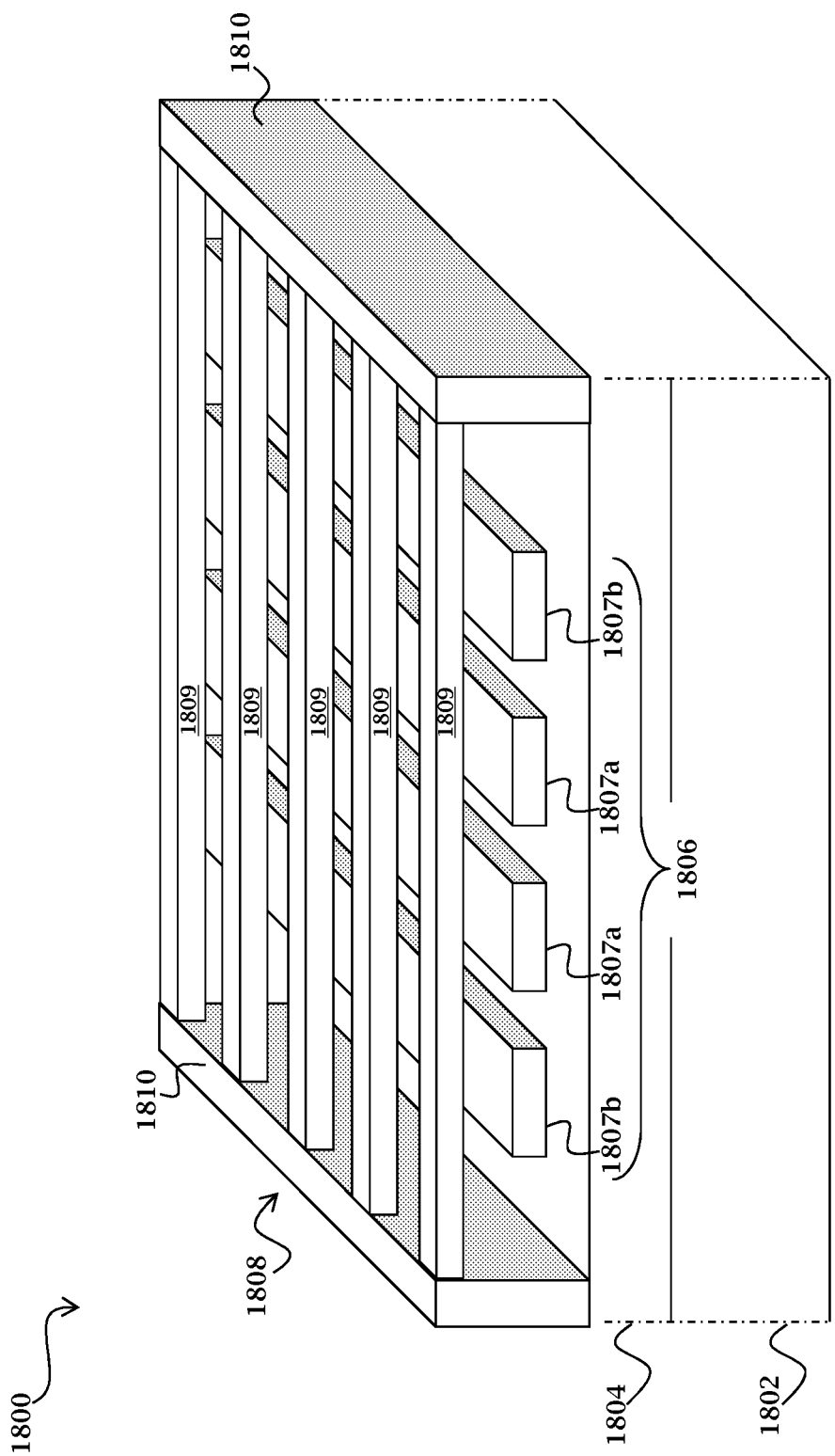
Figure 23:
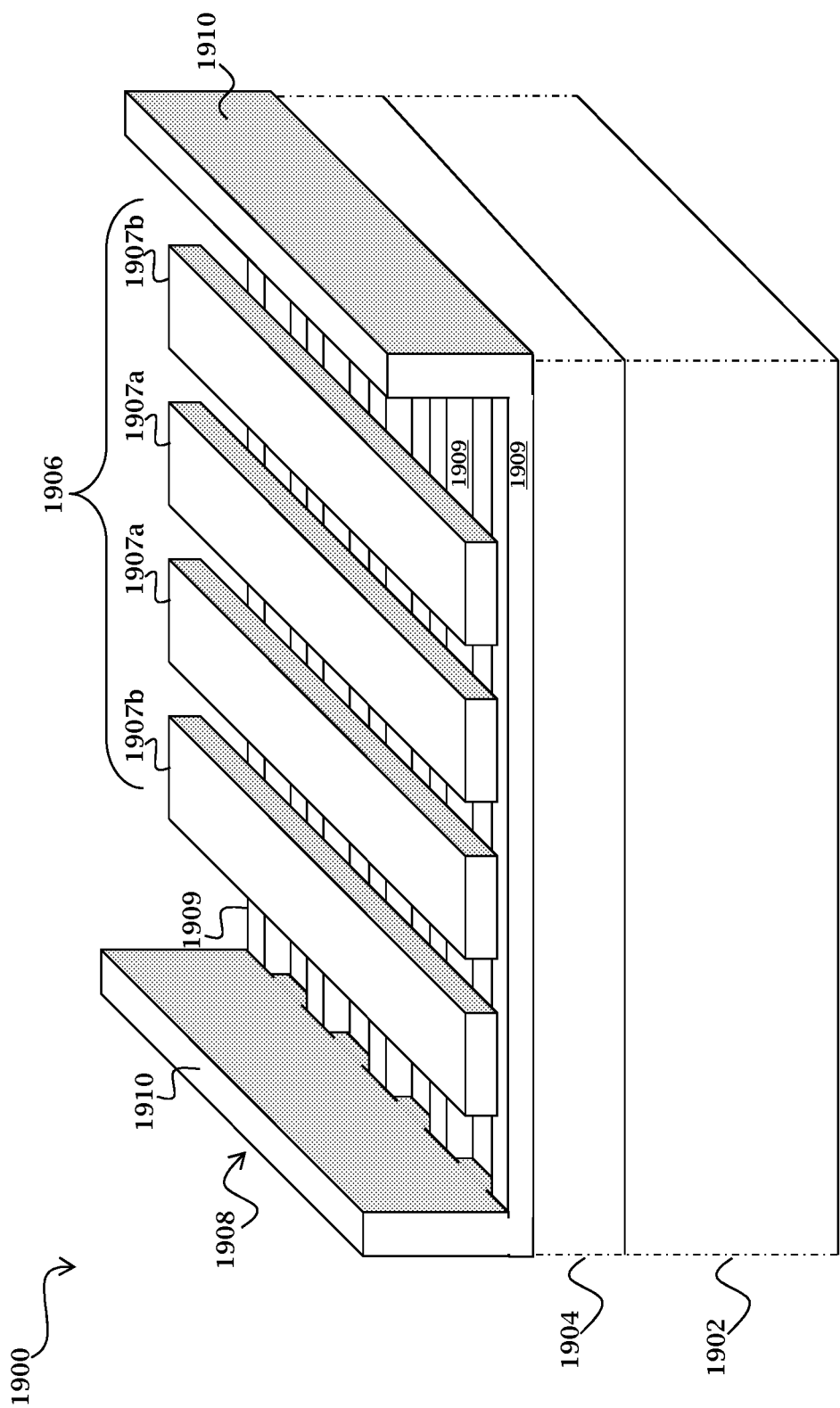
Figure 24:
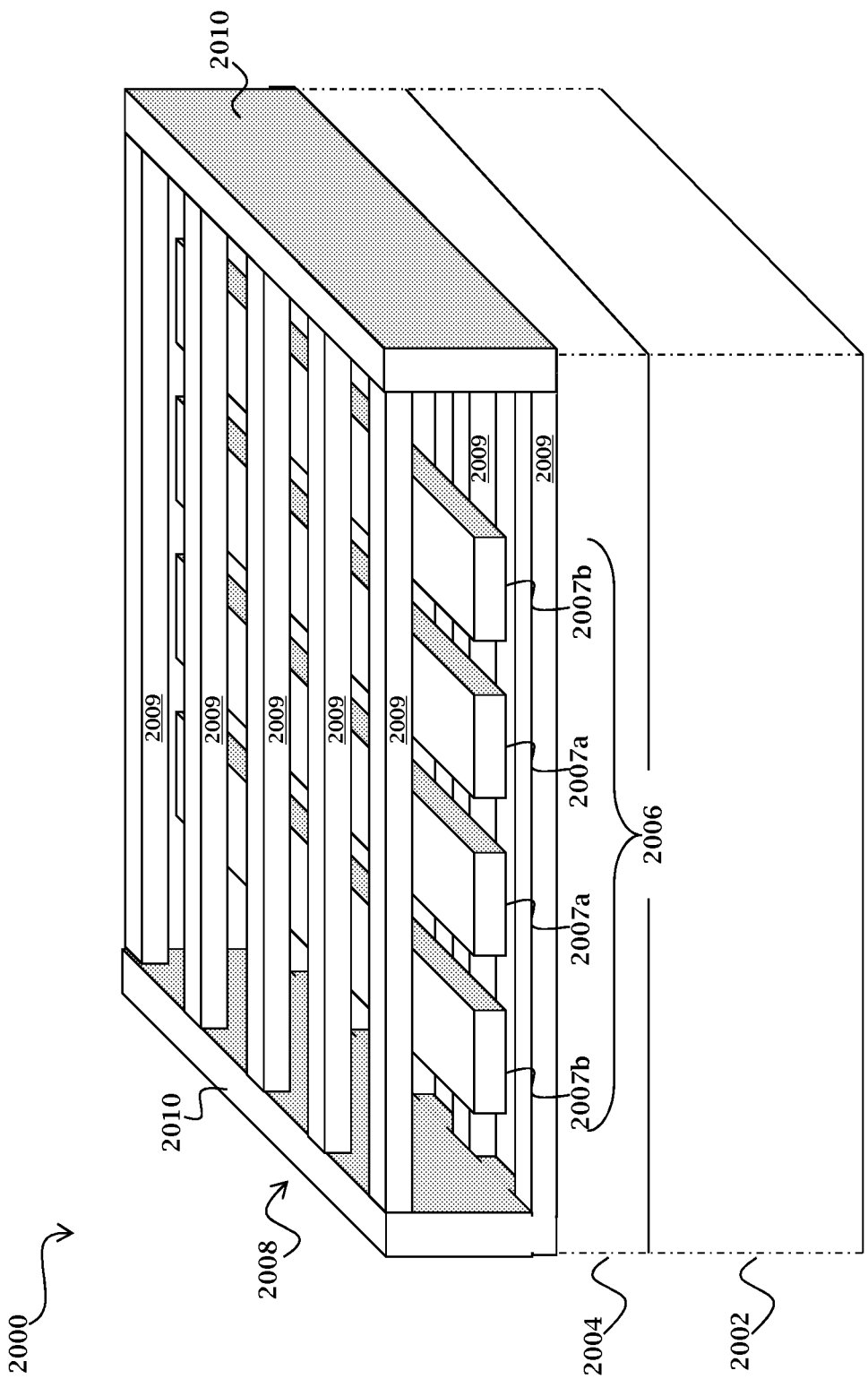

FIGS. 22, 23, and 24 provide transverse cross-sectional views of devices 1800, 1900, and 2000 respectively comprising shielding structures according to various embodiments. In FIG. 22, the device 1800 comprises a lower substrate 1802, an upper substrate 1804, a coplanar waveguide structure 1806 including one or more conductor lines 1807a, 1807b, and a shielding structure 1808 including one or more slot-type floating strips 1809 and one or more slot-type grounded strip extensions 1810. In FIG. 23, the device 1900 comprises a lower substrate 1902, an upper substrate 1904, a coplanar waveguide structure 1906 including one or more conductor lines 1907a, 1907b, and a shielding structure 1908 including one or more slot-type floating strips 1909 and one or more slot-type grounded strip extensions 1910. In FIG. 24, the device 2000 comprises a lower substrate 2002, an upper substrate 2004, a coplanar waveguide structure 2006 including one or more conductor lines 2007a, 2007b, a shielding structure 2008 comprising one or more slot-type floating strips 2009 and one or more slot-type grounded strip extensions 2010. The lower substrates 1802, 1902, 2002; upper substrates 1804, 1904, 2004; and coplanar waveguide structures 1806, 1906, 2006 including one or more conductor lines 1807a, 1807b, 1907a, 1907b, 2007a, 2007b are respectively similar to the lower substrates, upper substrates, and coplanar waveguide structures including one or more conductor lines described above.

The shielding structures 1808, 1908, 2008 including the slot-type floating strips 1809, 1909, 2009 are also similar to the shielding structures including slot-type floating strips described above, except the shielding structures 1808, 1908, 2008 are coupled to (and/or connected to) one or more slot-type grounding strip extensions 1810, 1910, 2010. For example, referring to FIG. 22, the slot-type floating strips 1809 of the shielding structure 1808 are formed above the coplanar waveguide structure 1806, and the slot-type grounding strip extensions 1810 extend from above the coplanar waveguide structure 1806 to below (or even with) the coplanar waveguide structure 1806 (i.e., extends downwardly toward the lower substrate 1802 and upper substrate 1804). Referring to FIG. 23, the slot-type floating strips 1909 of the shielding structure 1908 are formed below the coplanar waveguide structure 1906, and the slot-type grounding strip extensions 1910 extend from below the coplanar waveguide structure 1906 to above (or even with) the coplanar waveguide structure 1906 (i.e., extends upwardly away from the lower substrate 1902 and upper substrate 1904). Referring to FIG. 24, the slot-type floating strips 2009 of the shielding structure 2008 are formed above and below the coplanar waveguide structure 2006, and the slot-type grounding strip extensions 2010 extend from the slot-type floating strips 2009 above the coplanar waveguide structure 2006 to below the slot-type floating strips 2009 below the coplanar waveguide structure 2006. The slot-type grounding strip extensions 1810, 1910, 2010 may be coupled to (and/or connected with) the slot-type floating strips 1809, 1909, 2009. The slot-type grounding strip extensions 1810, 1910, 2010 may extend partially or entirely along the height of the coplanar waveguide structures 1806, 1906, 2006 and/or partially or entirely between the slot-type floating strips 2009 above the coplanar waveguide structure 2006 and the slot-type floating strips 2009 below the coplanar waveguide structure 2006. In the present embodiments, the slot-type grounding strip extensions 1810, 1910, 2010 are rectangular-shaped. It is contemplated that slot-type grounding strip extensions may include other shaped extensions, such as circular-shaped, elliptical-shaped, triangular-shaped, other suitable shapes, and/or combinations thereof. Further, similarly to the devices described above, the slot-type floating strips 1809, 1909, 2009 are oriented transversely to the coplanar waveguide structures 1806, 1906, 2006. It is understood that slot-type floating strips may be oriented differently in other embodiments.

The devices and structures disclosed herein may be formed using well-known manufacturing processes. Further, the devices and structures disclosed herein may be used in many products, including but not limited to items such as integrated circuits, monolithic microwave integrated circuits, radio frequency transmitters and receivers, radio frequency communication equipment, antennas, circuit boards, amplifiers, modulators, and demodulators. These and other items may be improved by using one or more of the devices and structures disclosed herein. For example, the devices and structures disclosed herein may allow some items to be made smaller, lighter, more efficient, more powerful, more sensitive, less noisy, more selective, faster, or cheaper.

In summary, a device for transmitting a radio frequency signal along a signal line is disclosed. The device includes a signal line that extends along a principal axis. To one side of the signal line is a first dielectric, and to an opposite side of the signal line is a second dielectric. Proximate to the first dielectric is a first ground line, and proximate to the second dielectric is a second ground line. The first and second ground lines are approximately parallel to the signal line. The device has a transverse cross-section that varies along the principal axis.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a coplanar waveguide structure oriented in a first direction, wherein the coplanar waveguide structure has a bottom surface and an opposing top surface; and
   a slot-type floating shield structure oriented proximate to the coplanar waveguide structure, wherein the slot-type floating shield structure includes a first portion that extends transversely to the coplanar waveguide structure in a second direction and a second portion extending from the first portion in a third direction that is perpendicular to the first direction and the second direction, and wherein the second portion extends beyond at least one of the top surface or the bottom surface of the coplanar waveguide structure.

2. The device of claim 1 wherein the coplanar waveguide structure and the slot-type floating shield structure include a conductive material.

3. The device of claim 1 wherein:
   the first portion of the slot-type floating shield structure includes a plurality of slot-type floating strips that extend in the second direction, the plurality of slot-type floating strips being located periodically along the first direction; and
   the second portion of the slot-type floating shield structure includes respective extensions from ends of each one of the plurality of slot-type floating strips.

4. The device of claim 3 wherein the extensions extend above the top surface of the coplanar waveguide structure.

5. The device of claim 3 wherein:
   the plurality of slot-type floating strips are located above the coplanar waveguide structure; and
   the respective extensions extend a distance from the ends of the plurality of slot-type floating strips beyond the coplanar waveguide structure.

6. The device of claim 5 wherein the extensions extend below the bottom surface of the coplanar waveguide structure.

7. The device of claim 3 wherein:
   the plurality of slot-type floating strips are located above and below the coplanar waveguide structure; and
   each of the extensions joins an end of a corresponding one of the plurality of slot-type floating strips located above the coplanar waveguide structure to an end of a corresponding one of the plurality of slot-type floating strips located below the coplanar waveguide structure, such that slot-type floating shields surround the coplanar waveguide structure.

8. The device of claim 3 wherein the plurality of slot-type floating shield structure further includes a first slot-type ground strip and a second slot-type ground strip that extend in the first direction, the first and second slot-type ground strips being coupled with the plurality of slot-type floating strips and extensions.

9. The device of claim 8 wherein:
the first slot-type ground strip joins one end of each of the plurality of slot-type floating strips;
the second slot-type ground strip joins another end of each of the plurality of slot-type floating strips; and
the extensions extend from the first slot-type ground strip and the second slot-type ground strip proximate to the ends of each of the plurality of slot-type floating strips.

10. The device of claim 9 wherein:
the plurality of slot-type floating strips, first slot-type ground strip, and second slot-type ground strip are located above the coplanar waveguide structure; and
the respective extensions extend a distance from the ends of the plurality of slot-type floating strips beyond the coplanar waveguide structure.

11. The device of claim 9 wherein:
the plurality of slot-type floating strips, first slot-type ground strip, and second slot-type ground strip are located below the coplanar waveguide structure; and
the respective extensions extend a distance from the ends of the plurality of slot-type floating strips beyond the coplanar waveguide structure.

12. The device of claim 3 wherein:
the plurality of slot-type floating strips are located above and below the coplanar waveguide structure;
the slot-type floating shield structure further includes a first slot-type ground strip, a second slot-type ground strip, a third slot-type ground strip, and a fourth slot-type ground strip that extend in the first direction, wherein:
the first slot-type ground strip joins one end of each of the plurality of slot-type floating strips located above the coplanar waveguide structure,
the second slot-type ground strip joins another end of each of the plurality of slot-type floating strips located above the coplanar waveguide structure,
the third slot-type ground strip joins one end of each of the plurality of slot-type floating strips located below the coplanar waveguide structure, and
the fourth slot-type ground strip joins another end of each of the plurality of slot-type floating strips located below the coplanar waveguide structure;
respective ones of the extensions extend from ends of each of the plurality of slot-type floating strips and between the first slot-type ground strip and the third slot-type ground strip; and
respective other ones of the extensions extend from ends of the plurality of slot-type floating strips and between the second slot-type ground strip the fourth slot-type ground strip.

13. A device comprising:
a semiconductor substrate;
an insulator layer disposed over the semiconductor substrate;
a coplanar waveguide structure disposed in the insulator layer, wherein the coplanar waveguide structure is oriented substantially along a first direction; and
a slot-type floating shield structure disposed in the insulator layer, wherein the slot-type floating shield structure is oriented proximate to the coplanar waveguide structure and includes:
a first portion that extends transversely to the coplanar waveguide structure in a second direction, and
a second portion that extends from the first portion in a third direction that is perpendicular to the first direction and the second direction, wherein the second portion extends above at least one of a top surface of the coplanar waveguide structure and a bottom surface of the coplanar waveguide structure.

14. The device of claim 13 wherein:
the first portion of the slot-type floating shield structure includes slot-type floating strips that extend in the second direction, the slot-type floating strips being located periodically along the first direction; and
the second portion of the slot-type floating shield structure includes respective extensions from ends of each one of the slot-type floating strips.

15. A device comprising:
a coplanar waveguide structure oriented in a first direction; and
a slot-type floating shield structure oriented proximate to the coplanar waveguide structure, wherein the slot-type floating shield structure includes:
a slot-type floating strip that extends transversely to the coplanar waveguide structure in a second direction, and
extensions from each end of the slot-type floating strip, wherein the extensions extend in a third direction that is perpendicular to the first direction and the second direction, and wherein the extensions extend in the third direction to at least a first distance, wherein the first distance is greater than a distance to a plane oriented in the first and second directions and co-planar with the coplanar waveguide structure.

16. The device of claim 15 wherein the slot-type floating shield structure further includes a slot-type ground strip coupled to one end of the slot-type floating strip and the extension extends from the slot-type ground strip at the one end of the slot-type floating strip.

17. The device of claim 15 wherein:
the slot-type floating strip is located above the coplanar waveguide structure; and
the extensions extend from the ends of the slot-type floating strip to the first distance beyond the coplanar waveguide structure.

* * * * *